(12) United States Patent
Factor et al.

(10) Patent No.: US 11,460,275 B2
(45) Date of Patent: Oct. 4, 2022

(54) DEVICE, SYSTEM, AND METHOD OF AIRCRAFT PROTECTION AND COUNTERMEASURES AGAINST THREATS

(71) Applicant: BIRD AEROSYSTEMS LTD., Herzliya (IL)

(72) Inventors: Ronen Factor, Ramat Gan (IL); David Dragucki, Be'erotayim (IL); Ariye Yehuda Caplan, Haifa (IL); Semion Zelikman, Rishon LeZion (IL)

(73) Assignee: BIRD AEROSYSTEMS LTD., Herzliya (IL)

(*) Notice: Subject to any disclaimer, the term of this patent is extended or adjusted under 35 U.S.C. 154(b) by 842 days.

(21) Appl. No.: 16/383,700

(22) Filed: Apr. 15, 2019

(65) Prior Publication Data
US 2020/0072582 A1   Mar. 5, 2020

(30) Foreign Application Priority Data
Sep. 5, 2018 (IL) .......................................... 261605

(51) Int. Cl.
*F41H 11/02* (2006.01)
*F41H 13/00* (2006.01)
(Continued)

(52) U.S. Cl.
CPC ......... *F41H 11/02* (2013.01); *F41H 13/0062* (2013.01); *G01S 13/72* (2013.01);
(Continued)

(58) Field of Classification Search
CPC ........ G01S 13/88; G01S 13/883; F41H 11/02; F41H 13/0062; G02B 27/0927;
(Continued)

(56) References Cited

U.S. PATENT DOCUMENTS 3,981,010 A * 9/1976 Michelsen .............. G01S 13/84
                                                          342/55
4,172,409 A   10/1979 Looss
(Continued)

FOREIGN PATENT DOCUMENTS

EP   1811315 A2   7/2007
EP   2239595 B1   10/2010
(Continued)

OTHER PUBLICATIONS

Letter from the European Patent Office (EPO) in patent application EP 19172452, dated Nov. 27, 2019.
(Continued)

*Primary Examiner* — Peter M Bythrow
(74) *Attorney, Agent, or Firm* — Browdy and Neimark, PLLC

(57) ABSTRACT

Device, system, and method of aircraft protection and countermeasures against threats. A system for protecting an aircraft against a threat, includes a dual frequency Radio Frequency (RF) module, which includes: a dual-band RF transmitter and a dual-band RF receiver, to transmit and receive high-band RF signals and low-band RF signals; and a threat confirmation and tracking module, to confirm and track a possible incoming threat based on processing of high-band RF signals and low-band RF signals received by the dual-band RF receiver. The system further includes a dual frequency band antenna, to transmit and receive the high-band RF signals and the low-band RF signals. The system also includes a directed high-power laser transmitter, to activate a directed high-power laser beam as countermeasure towards a precise angular position of a confirmed threat.

50 Claims, 7 Drawing Sheets

(51) Int. Cl.
*G01S 13/72* (2006.01)
*G02B 27/09* (2006.01)
*H01S 5/34* (2006.01)
*H01S 5/40* (2006.01)
*F25B 21/02* (2006.01)
*H01S 5/024* (2006.01)

(52) U.S. Cl.
CPC ........ *G02B 27/0927* (2013.01); *H01S 5/3402* (2013.01); *H01S 5/4012* (2013.01); *H01S 5/4087* (2013.01); *F25B 21/02* (2013.01); *H01S 5/02407* (2013.01); *H01S 5/02415* (2013.01); *H01S 5/02469* (2013.01)

(58) Field of Classification Search
CPC .... H01S 5/3402; H01S 5/4012; H01S 5/4087; H01S 5/02407; H01S 5/02415; H01S 5/02469; F25B 21/02
See application file for complete search history.

(56) References Cited

U.S. PATENT DOCUMENTS

| | | | | |
|---|---|---|---|---|
| 4,409,468 | A | 10/1983 | Mayer | |
| 4,780,719 | A * | 10/1988 | Frei | G01S 13/86 342/67 |
| 5,122,801 | A | 6/1992 | Hughes | |
| 5,136,295 | A | 8/1992 | Bull | |
| 5,204,489 | A | 4/1993 | Pellarin | |
| 5,268,680 | A * | 12/1993 | Zantos | H01Q 1/281 343/781 CA |
| 5,431,084 | A | 7/1995 | Fowler | |
| 5,574,458 | A | 11/1996 | Tran | |
| 5,662,291 | A | 9/1997 | Sepp | |
| 6,055,909 | A | 5/2000 | Sweeny | |
| 6,145,428 | A | 11/2000 | Gold | |
| 6,231,002 | B1 | 5/2001 | Hibma | |
| 6,369,885 | B1 | 4/2002 | Brown | |
| 6,410,897 | B1 | 6/2002 | O'Neill | |
| 6,674,520 | B1 | 1/2004 | Hicks | |
| 6,707,052 | B1 | 3/2004 | Wild | |
| 6,738,012 | B1 | 5/2004 | Kirkpatrick | |
| 6,771,205 | B1 | 8/2004 | Barton | |
| 6,920,827 | B2 | 7/2005 | Llyod | |
| 6,980,151 | B1 | 12/2005 | Mohan | |
| 6,980,152 | B2 | 12/2005 | Steadman | |
| 7,046,187 | B2 * | 5/2006 | Fullerton | F41H 11/00 342/21 |
| 7,104,496 | B2 | 9/2006 | Chang | |
| 7,425,916 | B2 | 9/2008 | Stevens | |
| 7,446,315 | B1 * | 11/2008 | Tidwell | F41G 7/224 250/338.1 |
| 7,492,308 | B2 * | 2/2009 | Benayahu | G08B 13/18 342/55 |
| 7,495,198 | B2 | 2/2009 | Ari | |
| 7,551,121 | B1 | 6/2009 | O'Connell | |
| 7,688,247 | B2 | 3/2010 | Anschel | |
| 7,709,772 | B1 | 5/2010 | Patel | |
| 8,082,832 | B1 * | 12/2011 | Tidwell | H04B 10/25 89/1.8 |
| 8,212,709 | B2 * | 7/2012 | Bradley | F41G 7/224 342/13 |
| 8,258,998 | B2 * | 9/2012 | Factor | F41H 11/02 342/13 |
| 8,672,223 | B2 * | 3/2014 | Factor | F41H 13/005 342/53 |
| 8,743,347 | B1 * | 6/2014 | Corella | F41H 13/0056 356/3.01 |
| 9,093,822 | B1 * | 7/2015 | Chann | H01S 5/4062 |
| 9,109,862 | B2 * | 8/2015 | Factor | G01S 13/867 |
| 9,170,069 | B1 * | 10/2015 | Smith | F41G 7/224 |
| 9,321,128 | B2 * | 4/2016 | Bradley | B23K 26/0096 |
| 9,620,933 | B1 * | 4/2017 | Huang | H01S 5/4087 |
| 9,865,985 | B1 * | 1/2018 | Chann | H01S 3/105 |
| 11,248,879 | B1 * | 2/2022 | Barfoot | F41H 13/005 |
| 2005/0062638 | A1 | 3/2005 | Zeineh | |
| 2005/0275582 | A1 | 12/2005 | Mohan | |
| 2006/0028373 | A1 * | 2/2006 | Fullerton | F41H 11/00 342/67 |
| 2006/0060691 | A1 | 3/2006 | Burns | |
| 2006/0065774 | A1 | 3/2006 | Roques | |
| 2006/0097102 | A1 | 5/2006 | Chang | |
| 2006/0103569 | A1 | 5/2006 | Pappert | |
| 2007/0052806 | A1 | 3/2007 | Bnayahu | |
| 2007/0075182 | A1 * | 4/2007 | Fetterly | G01S 7/495 244/3.15 |
| 2007/0201015 | A1 | 8/2007 | Gidseg | |
| 2007/0205366 | A1 * | 9/2007 | Gidseg | F41H 11/02 250/348 |
| 2007/0255672 | A1 | 11/2007 | Olsson | |
| 2008/0017752 | A1 | 1/2008 | Shukrun | |
| 2008/0018520 | A1 | 1/2008 | Moreau | |
| 2008/0111728 | A1 | 5/2008 | Stevens | |
| 2009/0224958 | A1 | 9/2009 | Aphek | |
| 2010/0126335 | A1 | 5/2010 | Saban | |
| 2010/0253567 | A1 * | 10/2010 | Factor | G01S 13/867 342/52 |
| 2010/0283655 | A1 | 11/2010 | Dunn | |
| 2010/0288877 | A1 | 11/2010 | Strabala | |
| 2011/0069145 | A1 | 3/2011 | Weber | |
| 2011/0084195 | A1 * | 4/2011 | Schaub | F41G 7/224 359/429 |
| 2011/0113949 | A1 * | 5/2011 | Bradley | F41H 13/0062 29/428 |
| 2011/0127328 | A1 | 6/2011 | Warren | |
| 2012/0033697 | A1 * | 2/2012 | Goyal | H01S 5/3402 372/45.01 |
| 2012/0068874 | A1 * | 3/2012 | Corella | G01S 7/495 342/14 |
| 2012/0101658 | A1 * | 4/2012 | Bradley | F41H 13/0062 219/121.72 |
| 2012/0120972 | A1 * | 5/2012 | Belenky | B82Y 20/00 372/45.01 |
| 2012/0213513 | A1 * | 8/2012 | Chao | F41H 13/0056 250/495.1 |
| 2012/0298748 | A1 * | 11/2012 | Factor | G01S 7/495 235/400 |
| 2013/0082183 | A1 * | 4/2013 | Mudge | B01J 19/12 250/372 |
| 2013/0140283 | A1 * | 6/2013 | Bradley | A61K 31/7105 219/121.72 |
| 2014/0027708 | A1 * | 1/2014 | Goyal | B82Y 20/00 257/9 |
| 2014/0102288 | A1 * | 4/2014 | Yeshurun | F41H 11/00 89/36.17 |
| 2014/0147116 | A1 * | 5/2014 | Krupkin | F41G 7/224 398/39 |
| 2014/0209678 | A1 * | 7/2014 | Factor | F41H 13/005 342/53 |
| 2014/0251123 | A1 * | 9/2014 | Venema | F41G 3/06 89/41.22 |
| 2014/0266851 | A1 * | 9/2014 | Fink | G01S 7/38 342/14 |
| 2014/0368814 | A1 * | 12/2014 | Krupkin | F41G 7/224 356/139.08 |
| 2016/0048129 | A1 * | 2/2016 | Kolanek | G05D 1/0022 701/2 |
| 2016/0245907 | A1 * | 8/2016 | Parker | G01S 7/38 |
| 2017/0192089 | A1 * | 7/2017 | Parker | F41H 11/02 |
| 2017/0300047 | A1 * | 10/2017 | Kolanek | F42B 15/01 |

FOREIGN PATENT DOCUMENTS

| | | |
|---|---|---|
| EP | 2527865 B1 | 11/2012 |
| EP | 2811315 A1 | 12/2014 |
| EP | 2811315 B1 | 12/2014 |
| FR | 2932896 A1 | 12/2009 |
| GB | 2342983 A | 4/2000 |
| IL | 178525 | 11/2012 |

(56) References Cited

FOREIGN PATENT DOCUMENTS

WO           94/11750 A1    5/1994
WO    2012/052914 A2    4/2012

OTHER PUBLICATIONS

Letter from the European Patent Office (EPO) in patent application EP 19172452, dated Sep. 27, 2021.
Bernhard Molocher et al., "DIRCM FLASH Flight Tests", Emerging Electro-Optic Phenomenology and Technology, Oct. 2005.
Espacenet, Abstract in English of patent application FR 2932896 A1; printed on Jul. 16, 2019 from: https://worldwide.espacenet.com/publicationDetails/biblio?II=0&ND=3&adjacent=true&locale=en_EP&FT=D&date=20091225&CC=FR&NR=2932896A1&KC=A1#.

* cited by examiner

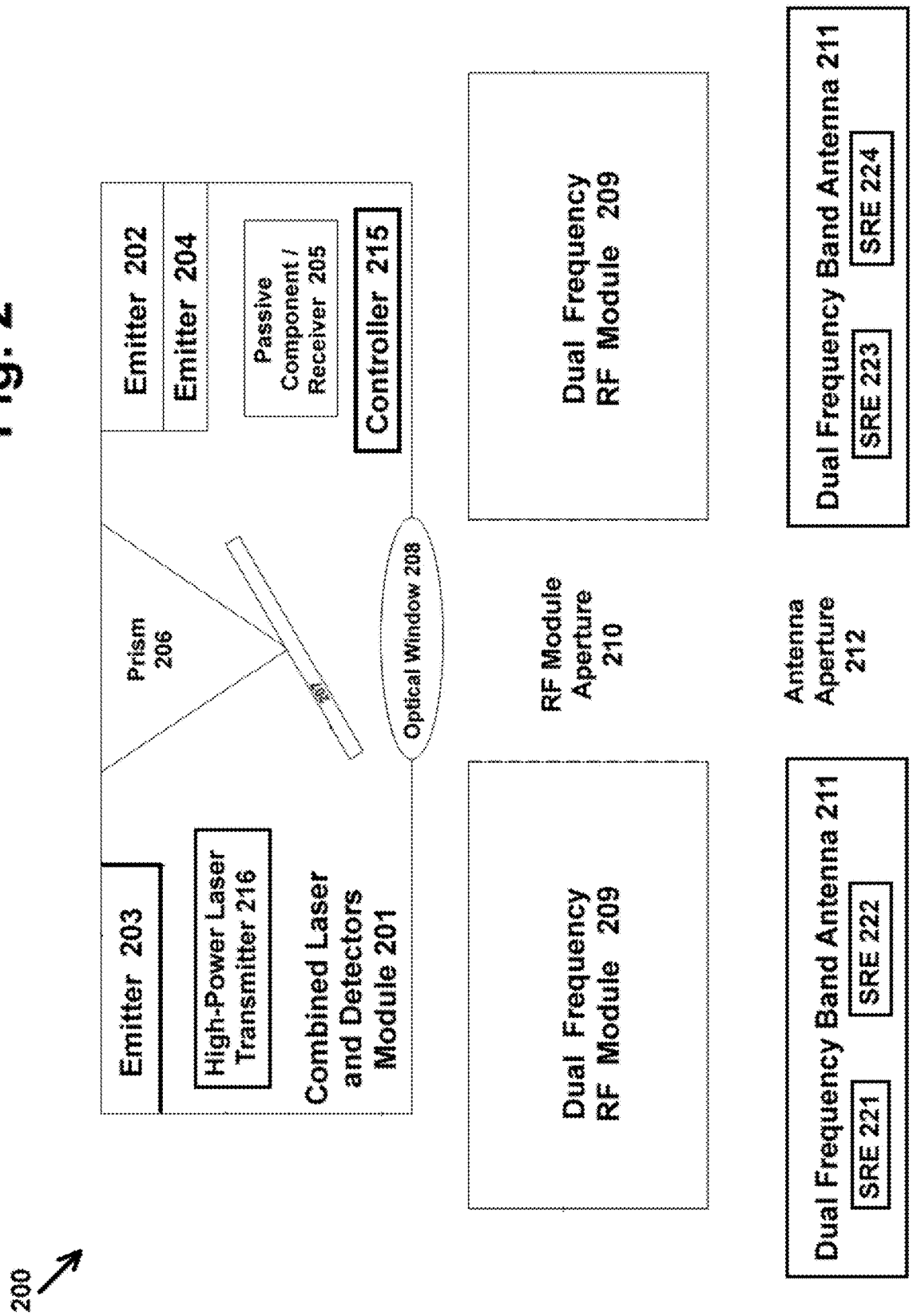

DEVICE, SYSTEM, AND METHOD OF AIRCRAFT PROTECTION AND COUNTERMEASURES AGAINST THREATS

CROSS-REFERENCE TO RELATED APPLICATIONS

This application claims priority from Israeli patent application number IL 261605, filed at the Israel Patent Office on Sep. 5, 2018, which is hereby incorporated by reference in its entirety.

FIELD

Some embodiments relate to the field of aircraft protection.

BACKGROUND

An aircraft is a machine that is able to fly, for example, by gaining support from the air. An aircraft counters the force of gravity by using static lift, or by using the dynamic lift of an airfoil, or by using downward thrust from jet engines. Common types of aircraft may include, for example, a fixed-wing aircraft such as an airplane, a rotary-wing aircraft or rotorcraft such as a helicopter, an Unmanned Aerial Vehicle (UAV) or a drone, or the like.

Civil aircraft and military aircraft may be exposed to threats from terrorists, military forces, or hostile entities. For example, an enemy soldier or a terrorist may attack an aircraft by launching towards the aircraft a shoulder-launched surface-to-air missile (SLSAM), or by using other type of man-portable air-defense system (MANPADS or MPADS).

SUMMARY

The present invention comprises devices, systems, and methods of infrared countermeasures (IRCM) and direct infrared countermeasures (DIRCM), particularly for protecting aircrafts against missiles and other threats or incoming threats. For example, a DIRCM system in accordance with some embodiments may comprise passive optical components and active optical components, in a unified packaging or encapsulation or housing, able to operate even in high temperature environments.

The present invention comprises devices, systems, and methods of aircraft protection and countermeasures against threats. For example, a system for protecting an aircraft against a threat, comprises a dual frequency Radio Frequency (RF) module, which includes: a dual-band RF transmitter and a dual-band RF receiver, to transmit and receive high-band RF signals and low-band RF signals; and a threat confirmation and tracking module, to confirm and track a possible incoming threat based on processing of high-band RF signals and low-band RF signals received by the dual-band RF receiver. The system further includes a dual frequency band antenna, to transmit and receive the high-band RF signals and the low-band RF signals. The system also includes a directed high-power laser transmitter, to activate a directed high-power laser beam as countermeasure towards a precise angular position of a confirmed threat.

Embodiments of the present invention may provide other and/or additional benefits or advantages.

BRIEF DESCRIPTION OF THE DRAWINGS

FIG. 2 is a schematic illustration of a Direct Infrared Countermeasure (DIRCM) unit, in accordance with some demonstrative embodiments of the present invention.

DETAILED DESCRIPTION

Figure 1A:
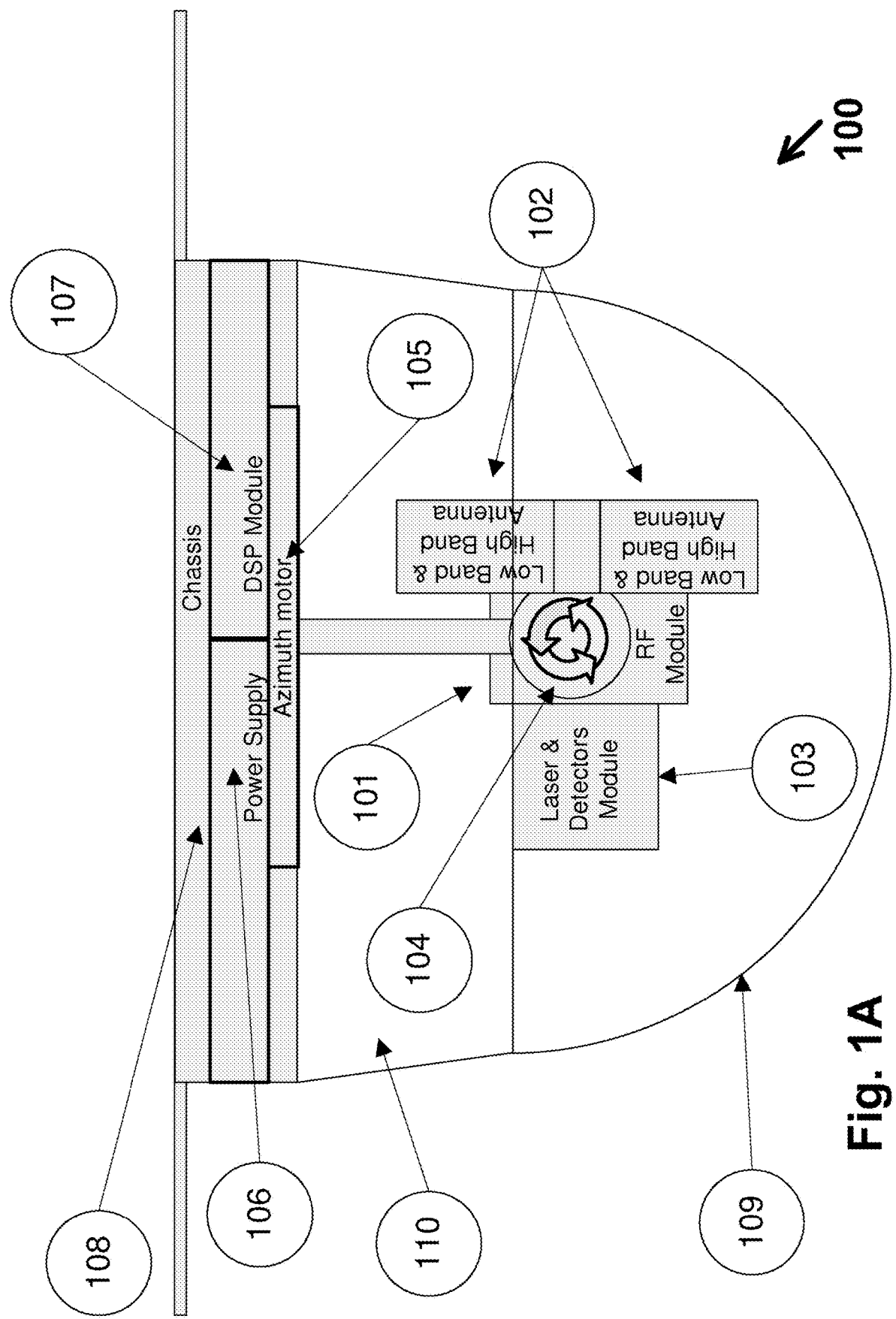
FIG. 1A is a schematic illustration of an aircraft protection system, in accordance with some demonstrative embodiments of the present invention.

The term "aircraft" as used herein includes, for example, a machine or apparatus able to fly; an airborne platform or object or vehicle; a vehicle or object which is able to fly through the air or through an atmosphere of a planet; a vehicle or object which is able to sustain itself above the ground; a flying machine operated on-board or controlled on-board, by an on-board human pilot or by an on-board human operator; a remote-controlled or remotely-controlled flying machine, operated or controlled remotely by a human operator and/or via another (e.g., flying or non-flying) machine or via a robot or a computer or a control station; an autonomous flying machine, or a self-operated flying machine; an airplane; a helicopter; a manned aircraft; an unmanned aircraft; a Remotely Piloted Vehicle (RPV); an Unmanned Aerial Vehicle (UAV); a fixed-wing aircraft; a rotorcraft or rotary-wing aircraft; an autogyro or gyroplane; a powered aircraft; an unpowered aircraft (e.g., a glider, a paraglider, a balloon, a kite); an aircraft having one or more propellers; a jet propulsion aircraft; a military aircraft (e.g., a fighter, a bomber, a fighter-bomber, a ground-attack aircraft, an attack helicopter); a civilian aircraft (e.g., commercial, executive, cargo); a rocket; a missile; a rocket-powered aircraft; a spaceship; a space shuttle; a satellite; a manned or unmanned space vehicle or aircraft or ship; a drone; an autonomous flying device; or the like.

The terms "aircraft" or "protected aircraft" as used herein may relate to an aircraft which is being protected or is intended to be protected against incoming threats; or an aircraft on which a self-protective unit or system is installed or mounted, or is intended to be installed or mounted.

The terms "incoming threat", "airborne threat", or "threat", as used herein include, for example, a missile, a rocket, a bomb, a self-propelled projectile, an airborne missile, an airborne object directed towards a protected aircraft, a missile having an engine and/or a warhead, a cruise missile, a guided missile, or the like. In some embodiments, optionally, the term "threat" may relate to a verified threat, a non-verified threat, a confirmed threat, an unconfirmed threat, a possible threat, an estimated threat, or other types of threats.

Some embodiments of the present invention comprise devices, systems, and methods of infrared countermeasures (IRCM) and direct infrared countermeasures (DIRCM), particularly for protecting aircrafts against missiles and other incoming threats. For example, a DIRCM system in accordance with some embodiments may comprise passive optical components and active optical components, in a unified packaging or encapsulation or housing, able to operate even in high temperature environments.

In accordance with some embodiments, an aircraft may be equipped with missile protection system or man-portable air-defense (MANPAD) protection system. Such protection system may comprise, for example, one or more imagers or imaging sensors (e.g., Ultra-Violet (UV) or Infra-Red (IR) electro-optic sensors, and/or visible light imaging sensors) and/or other Missile Warning Sensors (MWS) (e.g., a pulse-Doppler radar MWS), in order to sense, detect, confirm, verify and/or track an incoming threat.

In accordance with some embodiments, an aircraft may be equipped with one or more types of infrared countermeasure (IRCM) devices or systems, to prevent a MANPAD unit or MANPAD missile from hitting the aircraft. Such IRCM systems may comprise one or more types of flares, and/or a Direct Infra-Red Counter Measure (DIRCM) unit, which may emit electromagnetic waves or electromagnetic radiation at one or more (e.g., particular) optical wavelengths or at a particular band of optical wavelengths or at particular segment(s) of the spectrum.

In accordance with some embodiments, a DIRCM unit may comprise one or more high-power laser transmitters or laser emitters or laser generators or laser units, or other suitable devices (e.g., a lamp or other optical signal emitter or transmitter or generator), that emit or transmit or generate or produce or output one or more laser beams. The emitted laser beams may have one or more particular wavelengths or band(s)-of-wavelengths; such as, but not limited to, visible wavelength, Short-Wave Infra-Red (SWIR) wavelength, Medium-Wave Infra-Red (MWIR) wavelength, or any other wavelength that is known to those skilled in the art.

In accordance with some embodiments, a DIRCM unit may generate and emit high-power optical signals, while also maintaining a small form-factor and/or small footprint and/or small physical size, in order to allow the mounting and integration of such DIRCM unit on aircrafts with little or minimal impact on the weight and/or size and/or the aerodynamic properties of an aircraft.

The Applicants have realized that a heavy, large-footprint, large form-factor, large-size, and/or cumbersome anti-missile system, which may be suitable for utilization as a non-flying Surface-to-Air (SAM) ground-based missile defense system, cannot simply be mounted on an aircraft due to their negative and/or determinantal impact on the weight and/or size and/or the aerodynamic properties of an aircraft and/or the operational properties or constraints of the aircraft. Thus, a custom designed Surface-to-Air (SAM) airborne based missile defense system is proposed herein, and is structured and implemented due to reasons discussed herein in where one of the main Surface-to-Air (SAM) missiles threats and/or Man Portable Air Defense Missiles (MANPADs). The system and units of the present invention are, in some embodiments, light-weight and/or having a small form-factor and/or having a small footprint and/or having an aerodynamic contour and/or are compatible with (and suitable for) mounting on or under an aircraft; in contrast with a heavy, bulky, cumbersome missile-defense system which is not suitable for simply "connecting" to an aircraft, as it would make the aircraft too heavy and/or too large and/or non-aerodynamic and/or less agile and/or may cause other disadvantages to the aircraft.

In accordance with some embodiments, a laser unit or laser generator which may be part of a DIRCM unit, may comprise or may be based on, for example, Quantum Cascade Laser (QCL) component(s) or QCL technology, diode laser technology, and/or other laser-based technology or components that are capable of performing a successful countermeasure to an incoming threat (e.g., a MANPAD missile).

The Applicants have realized that while activating and/or operating a QCL-based laser component, a diode-based laser unit, or other types of laser units that operate on (or in conjunction with) infrared (IR) wavelengths, there may be a limited range of acceptable working temperature that is mainly applicable to high ambient temperatures. The Applicants have also realized that the limitations or constraints in operational temperature of the laser unit may be, for example, due to a relatively-small energy band gap between valence band and conductive band, that allows a competition between photon generation according to $hc/\lambda$ factor and phonon generation according to $kT$ factor. The Applicants have further realized that both photons and phonons are close in the energy quantity, where h is the Planck constant, C is the speed of light, $\lambda$ is the wavelength, k is the Boltzmann constant, and T is the temperature. The Applicants have realized that as the phonon generation probability increases due to an increase in the ambient temperature, the laser unit emits a phonon rather than a photon, yielding a higher probability of phonon emission rather than photo emission; and this may cause degradation or decrease in conversion efficiency, and/or loss of optical power (e.g., in some situations, even a reduction down to zero or almost zero).

The Applicants have realized that this problem may become more severe when a DIRCM laser unit, with its active and passive components, is mounted or installed in a high-temperature environment (e.g., on a gimbal or a gimbaling unit; and/or in proximity to local heating elements or nearby heat-producing elements; or in proximity to a hot engine or hot component of an aircraft); and such high-temperature environment may lead to a situation where laser power emission decreases or degrades significantly, and may even reach non-operational levels or inefficient levels (e.g., effectively becoming a low-power or a very-low-power laser unit which is incapable of protecting the aircraft against an incoming threat).

The Applicants have also realized that the active and passive components of a laser unit typically utilize a Thermal Electric Cooler (TEC) or a cryogenic cooler or other cooling element; however, the TEC or the cooling element by itself may actually increase the generated heat at particular nearby regions, and may even generate a factor of between 2 to 4 times of additional heat, which needs to be evacuated; thereby further burdening on the heat evacuation system(s) that is associated with the DIRCM or its laser unit.

The Applicants have further realized that heat evacuation problems may increase when the DIRCM or its laser unit are mounted on a gimbal or a gimbaling unit, and/or are moving or rotating (or are configured to be moved or rotated) via gimbal motor(s) or other gimbaling elements. However, such mounting and gimbaling capabilities of the mechanical interface may be important for efficient operation of a DIRCM unit and/or its laser unit, for example, due to the need for tolerance chain minimizing, stability under mechanical shocks, capability of operating in extreme conditions, and/or vibrations caused by the aircraft or the platform.

The Applicants have also realized that the active components of a DIRCM laser unit may have a very narrow divergence, in order to provide maximum laser power density; since larger DIRCM output power density increases the probability of preventing the incoming threat (e.g., the MANPAD missile) from hitting the aircraft. Accordingly, to support such narrow divergence, an additional tracking sensor may be installed as part of DIRCM architecture; since a typical MWS by itself may not provide the sufficient accuracy that is required for the optimum or efficient or successful operation of the DIRCM unit. The additional tracking sensor may be, for example, a UV sensor or imager, a visible light sensor or imager, an IR sensor or imager, a radar-based sensor, a combination of multiple such sensors, or the like. The tracking sensor(s) may need to be cooled, for example, using TEC or cryogenic coolers; and such tracking sensor(s) are typically mounted or installed tightly or in adjacent proximity to the DIRCM laser unit(s), to ensure minimum angular error between the tracking sensor(s) and the DIRCM laser unit(s) during system operation. Accordingly, the installation or mounting of the DIRCM laser components and the tracking sensor(s) in proximity to each other and/or adjacent to each other and/or within the same laser-based module that is mounted on a gimbal, further decreases the system's dimensions and/or form-factor and/or footprint and/or weight, yet it also decreases the system's thermal dissipation and the optical error between the DIRCM laser unit(s) and the tracking sensor.

The Applicants have also realized that the active components of a DIRCM laser unit may have an output power that is at least in the magnitude of Watt or more. Due to various constraints, different optical combination techniques (such as, but not limited to, coherent optical combination, non-coherent optical combination using optical components inside the DIRCM unit, or free air optical combination) may be used to combine the output power from two or more laser units or laser components. However, the usage of such optical elements may decrease the combined output power of the DIRCM unit, and/or may increase the required volume or form-factor or footprint or size of the DIRCM unit, and/or may increase the thermal load of the DIRCM unit.

The Applicants have realized that a conventional laser module which includes several laser emitters installed on the same thermal interface, particularly on a moving gimbal with additional nearby components that provide additional heat, may cause severe degradation of the laser performance and/or its output power; and that some of laser unit components that are limited in their operational temperature may be damaged temporarily or even permanently due to insufficient or inadequate heat management.

The Applicants have further realized that the particular manner in which a DIRCM or IRCM unit operates, such as a set of short pulses of laser emissions with relatively long periods of no laser emissions between such sets (e.g., particularly if there are zero or near-zero or very few false alarms, such as by using a MACS radar or other suitable radar or sensor), and having a very low duty cycle, may enable to construct and utilize a novel heat dissipation architecture or heat evacuation architecture.

The Applicants have also realized that a laser module (e.g., particularly of a DIRCM or IRCM unit) that is mounted on a gimbal or a gimbaling mechanism, may interfere or disrupt or negatively affect the balance of the gimbal, and/or may increase or may modify its Moment Of Inertia (MOI); thereby degrading the performance of the gimbal (or, the operational properties of the gimbal, its responsiveness, its accuracy, or the like) in a manner that negatively impacts the gimbal which should otherwise be very fast and very accurate.

The Applicants have realized that a laser module for IRCM or DIRCM applications may need to be flexible or modular, to enable implementation with any relevant need or to achieve a variety of deployment goals, such as in terms of required wavelength and/or required output power, as well as balancing or finding the suitable trade-off among such operational properties.

Some embodiments of the present invention may include, for example, systems, devices, and methods of QCL based laser units, diodes based laser units, and other lasers units, as well as packaging and mounting of such laser units, particularly operably in high temperature and/or in proximity to local heat generation and/or in a highly vibrating environment; as well as IRCM or DIRCM or countermeasures that comprise such laser units, aircraft components or aircraft-interfacing components (e.g., a Line-Replaceable Unit (LRU) or other interchangeable unit) that comprise such laser units, and aircrafts that comprise or that utilize such laser units.

Some embodiments of the present invention may include a Thermal Electric Cooler (TEC), and particularly a dual-stage or triple-stage or multiple-stage TEC for utilization in conjunction with (or near, or in proximity to, or adjacent to) a laser unit or an IRCM unit or a DIRCM unit of (or for) an aircraft. For example, a dual-stage TEC may comprise: a first TEC stage which is attached to the laser emitter chip or unit, and handles the instantaneous heat dissipation; and a second TEC stage which maintains a working temperature for the whole module that will be sufficient for the local TEC to keep a working temperature required by the chip.

Some embodiments of the present invention may include a laser module or a laser unit a structure or unit that is isolated from external ambient impacts or ambience, and having only a single conducting thermal interface that is attached to the external TEC. This may cause a single-direction (uni-directional) heat transfer, from the laser module box to the external ambient component(s) or surroundings or environment. In view of the nature of DIRCM laser components and their manner of operation (e.g., a set of one or more short-durations pulses, that occur once in a long period of time, such as once per minute or once per hour), the external TEC has sufficient time to stabilize the temperature until the next iteration of laser operation (e.g., even though, in some scenarios, the heat evacuation from the second TEC may be by itself a relatively less-efficient process, due to the fact that this second TEC has to evacuate the heat from first TEC, in addition to evacuating the self heat and thus is counter-intuitive yet it produces an overall improved operational result). In some embodiments, a first stage of the dual-stage heat may evacuate some heat towards, or in the direction of, or in proximity to, the second stage of the dual-stage TEC; which, initially, may be counter-intuitive or may be a non-conventional approach, since a conventional cooling elements operates to remove or evacuate heat entirely from the region-of-interest that requires cooling or that requires heat-evacuation; however, the Applicants have realized that due to the particular operational characteristics of the IRCM or DIRCM unit (e.g., spaced-apart sets of laser-emission bursts, with non-operational time gaps or time-periods (e.g., of at least 5 or 10 or 30 or 60 or K seconds) between two consecutive sets of bursts), causes this particular dual-stage structure of the TEC to effectively provide heat evacuation in a manner that enables the laser emitters to maintain the adequate operational temperature and not to exceed it, and in a manner that allows one of the two stages of the TEC (e.g., the second stage of the dual-stage TEC) sufficient time between two consecutive sets of bursts of laser emissions to evacuate the heat that was partially evacuated or moved (but not necessarily entirely removed) by the first stage of the dual-stage TEC.

Some embodiments of the present invention may comprise or may utilize a mono-wavelength, single-wavelength, dual wavelength, triple wavelength, or multiple wavelength laser module or laser unit, as part of an IRCM unit or a DIRCM unit or other aircraft protection unit. The unique structure and functionalities of the laser unit or module of the present invention may enable a modular assembly of "one to many" according to system demand or to meet particular deployment goals; for example, an additional laser module can be efficiently assembled or added in order to achieve higher power level on the same wavelength and/or on one or more additional wavelengths.

Some embodiments of the present invention may comprise or may utilize a rigid structure that is fixed on mechanical interface surface (e.g., which is heated locally from the other side), while also being thermally isolated by means of a highly polished optical window or optical lens which is also thermally isolating (e.g., ceramic window or ceramic lens; ZnSe; Zinc selenide (ZnSe) window or lens; Aluminum Oxynitride window or lens; ALON® GRIN optical window or lens; or other rigid yet polishable, thermally-isolating material). The mechanical interface of the laser module is located at the opposite side of the laser emitter(s), to increase the thermal resistance from the laser emitter(s) to the mechanical interface.

Some embodiments of the present invention may comprise laser modules or laser units which may produce various types or strengths of output power based on different optical combinations and/or techniques, in order to increase the output power of such laser unit(s) while also minimizing the number and/or size and/or weight of the optical elements that are required to achieve such optical combination and such output power.

Some embodiments of the present invention may comprise or may utilize a unique mechanical, electrical and optical combination or assembly, between different laser components and uncooled passive optical detector or optical sensor or imager (e.g., which may be IR based, UV based, visible light based, or based on other suitable wavelengths or spectrum-segments), combined or encapsulated or packaged or co-located within a same, single, unified package; thereby reducing or minimizing the physical properties of the system, such as its dimensions, form-factor, footprint, weight, thermal impact, and/or aerodynamic signature; while also increase or improving IRCM or DIRCM performance parameters, such as, increasing or maximizing detection efficiency and/or detection accuracy and/or detection range and/or tracking range and/or target angular tracking accuracy.

In accordance with some embodiments, the thermal management of a laser unit (particularly of a DIRCM or IRCM unit) is achieved via physical separation between one side of the payload from the other side using a thermal isolator, such as ceramics, rigid plastic, or other stable material that can be polished to provide a high level of parallelism, surface quality and mechanical durability. In some embodiments, the entirety of the laser module is thermally isolated from inner ambient or from surrounding component(s) or environment, and has one side which operates as thermal interface. In some embodiments, one or more laser emitters are installed or mounted opposite to the mechanical interface in order to increase thermal resistivity.

In some embodiments, the isolated structure is sufficiently rigid, such that rigidity is transferred from the mechanical interface to the opposite surface that is connected to the laser emitter(s) and to the external TEC; and thus, structural Eigen frequencies remain sufficiently high, thereby decreasing the possibility of undesired structural interference.

In some embodiments, heat of the laser module is constantly evacuated to inner ambient of the gimbal, in order to maintain the laser emitter(s) temperature lower than the optimum operating temperature for laser module; and an external TEC evacuates the steady state heat flow from the gimbal inner ambient, while local heat dissipation is performed from the RF module to the laser emitter(s) environment.

In some embodiments, an activation of the laser module creates an instantaneous heat that is evacuated by the internal TEC. From the other side of the laser module, the internal TEC is sufficiently efficient only when its "hot plate" has a relatively low temperature; and this can be achieved by the external TEC. In some embodiments, the external TEC handles the steady state heat flow to the laser module inner ambient, and operates to stabilize the inner TEC "hot plate" temperature for an efficient cooling on the "cold plat" of the inner TEC. In some embodiments, the "hot plate" of the external TEC evacuates heat to gimbal inner ambient; this process or structure by itself is counter-intuitive and may not appear efficient by itself or per se, but due to the very low duty cycle of the laser module it is actually sufficient and efficient for stabilizing the temperature of the laser module towards or until next activation or the next iteration of the laser module.

In some embodiments, the unique structure of the laser module may minimize the impact of MOI, due to a planar structure in which some or most or all of the laser emitters and the optical paths are parallel or generally-parallel to the mechanical interface (or, to the longest axis or the longest dimension or the longest edge of the mechanical interface); thereby enabling the associated gimbal and its motor(s) to operate efficiently, rapidly and/or accurately.

Some embodiments may modularly integrate several laser emitters, to achieve multiple threat-jamming wavelengths and/or to achieve additional or increased laser output power (e.g., using the same laser emitter on one of four branches).

The terms "active component" or "active unit" or "active sensor" or "active detector" or "active counter-measure" as used herein may comprise, for example, a laser emitter, a laser transmitter, a laser generator, a unit able to perform lasing operations, a unit able to generate and/or emit and/or transmit electromagnetic radiation and/or electromagnetic signal(s) and/or optical signals such as but not limited to infrared (IR) signals and/or visible signals or other types of optical beams (e.g., particularly towards a particular direction or target), a counter-measuring unit that is capable of eliminating or destroying or neutralizing or disrupting or otherwise effectively impacting a threat, an active sensor or active detector which operates by sending or transmitting a signal or finite or infinite or continuous burst of similar or different signal types (or an outgoing signal), and then receiving or capturing or analyzing a signal or finite/infinite/continuous burst of similar or different signal types of feedback or a feedback signal (or an incoming signal), or the like.

The terms "passive component" or "passive unit" or "passive sensor" or "passive detector" as used herein may comprise, for example, a camera, an imager, a scanner, an optical sensor, a sensor or detector that collects or captures or acquires (and optionally, also processes and/or analyzes) incoming signals and/or incoming optical signals and/or incoming infrared (IR) signals and/or incoming ultraviolet (UV) signals and/or incoming electromagnetic signals and/or incoming electromagnetic radiation and/or incoming visible light signals, a unit that processes and/or analyzes incoming signals and/or sensed signals and/or sensed data (e.g., images, video frames, video stream), a unit that performs image recognition or image classification of tagging or information extraction from an image or a video (e.g., based on computerized vision algorithms, based on machine learning (ML) or deep learning (DL) or artificial intelligence (AI) algorithms or motion processing algorithms or units, or image/video compressing algorithms or units, a unit or sensor or detector that receives signals from a particular source (e.g., threat, target) but does not actively and/or purposely transmit signal(s) towards that particular source, and therefore cannot be identified by various types of electro-optic or electro-magnetic sensors (e.g., of the enemy), or the like.

Reference is made to FIG. 1A, which is a schematic illustration of an aircraft protection system 100, in accordance with some demonstrative embodiments of the present invention. System 100 may be implemented, for example, as a DIRCM or IRCM unit comprising at least two laser components (e.g., at least two laser emitters) that are integrated inside a laser module, and with provision for two additional active and passive components with their relevant optics or optical components.

A Radio Frequency module 101 may be connected to a dual frequency bands antenna 102, a high-power laser transmitter 103, and an elevation motor 104. The RF module 101 may be utilized by one or more components of a dual-band RF-based threat confirmation and threat tracking sensor (e.g., of a DIRCM or IRCM unit). For example, the RF module 101 may switch between transmitting a low-frequency waveform and a high-frequency waveform, or vice versa; the dual frequency bands antenna 102 receives incoming RF signals, which are then processed by a Digital Signal Processor (DSP) module 107 to enable threat detection, threat confirmation and/or threat tracking.

The dual frequency bands antenna 102 may be used for transmission and reception of the low frequency electromagnetic signal, as well as for transmission and reception of the high frequency electromagnetic signal, which may be used for verification of the threat and/or for calculation of the precise angular position of the threat. The dual frequency bands antenna 102 may optionally comprise one or more sub-modules, to enable gathering information that allows determination of threat direction at the required accuracy level. The dual frequency bands antenna 102 may comprise multiple layers or multiple regions, to allow multi bands operation. The dual frequency bands antenna 102 may comprise, or may be associated with, multiple or different interfaces for the low and high frequency bands operation. The multi-layer architecture of the dual frequency bands antenna 102 may utilize a dual layer patch technique, or other suitable technique(s). The dual frequency bands antenna 102 may have a precise built-in aperture or cavity or window, for outputting the signal of the high-power laser transmitter 103 through the center of the dual frequency bands antenna 102; or may otherwise have a structure in which antenna elements surround or encircle (partially or entirely) around the high-power laser transmitter 103.

The high-power laser module 103 may be used (e.g., in a selective manner, upon receiving an automated command to do so) for generating and transmitting high-power laser waveforms, for example, towards an incoming threat (e.g., towards a detected and/or confirmed and/or tracked incoming threat). The transmitted laser waveform may be constructed of various types of signals, for example, pulse wave, linear frequency modulated signal(s), and/or constant wave in one or more IR and/or visible spectral wavelength(s) and/or in one or more suitable segments of the electro-optic spectrum. Optionally, the transmitted waveforms may be in two or more IR spectral wavelengths simultaneously. The high-power laser module 103 may also include passive optical detectors that may be used, for example, to improve the accuracy of threat tracking.

An elevation motor 104 may be used for moving the RF module 101, the dual band frequency antenna 102 and/or the high-power laser module 103 along the elevation axis. The definition of the elevation axis may be, for example, based on the aircraft's elevation axis. The elevation motor 104 may be connected to an azimuth motor 105.

The azimuth motor 105 may be used for moving the RF module 101, the dual band frequency antenna 102, the high-power laser module 103, and/or the elevation motor 104, along the azimuth axis. The definition of the azimuth axis may be, for example, based on the aircraft's azimuth axis. The azimuth motor 105 may be connected to a mechanical chassis 108.

The mechanical chassis 108 may be used for installation (e.g., internal installation) of a power supply 106 and of the DSP module 107. Optionally, power supply 106 and DSP module 107 may be implemented as (or using) a single or joint electronic board or Integrated Circuit (IC) or Application-Specific Integrated Circuit (ASIC) having or comprising multiple electronic boards that may be connected together. The mechanical chassis 108 may comprise one or more external electrical connectors that may be used as connection to an interface 110 with the A/C, pulse Doppler radar MWS, and a central computer (e.g., of the aircraft).

The DSP module 107 may comprise or may be a digital signal processor or other suitable processor or controller or processing core or IC or ASIC; and may perform, for example, processing of the data generated from (or collected by) the low and high frequency bands of the RF Module 101 and/or triggering or pre-triggering the system countermeasure functionality. The DSP module 107 may also be used for calculation of threat fine angular position, based on the low frequency band data, in order to then activate or fine-tune the high frequency band functionality; and/or for calculation of threat precise angular position for activation of the IRCM or DIRCM functionality and thus controlling the elevation motor 104 and/or the azimuth motor 105.

A radome 109 may be or may comprise a housing or enclosure or dome or a transparent or semi-transparent encapsulation device or protective dome or sphere or semi-sphere or protective cover or encapsulating cover, for holding and/or encapsulating and/or protecting one or more components of system 100, for example, the RF module 101, any gimbals or gimbaling components, the elevation motor 104 and azimuth motor 105, the dual frequency bands antenna 102, and the high-power laser module 103. The protective radome 109 may allow transparent transmission and reception of electromagnetic signals at low and high frequency bands, and also pass-through transmission of the laser energy or laser beam that is generated by the high-power laser module 103. The radome 109 may have an aerodynamic shape for reducing the aerodynamic effects of installation or mounting of system 100 on (or under, or adjacently to) the aircraft.

Figure 1B:
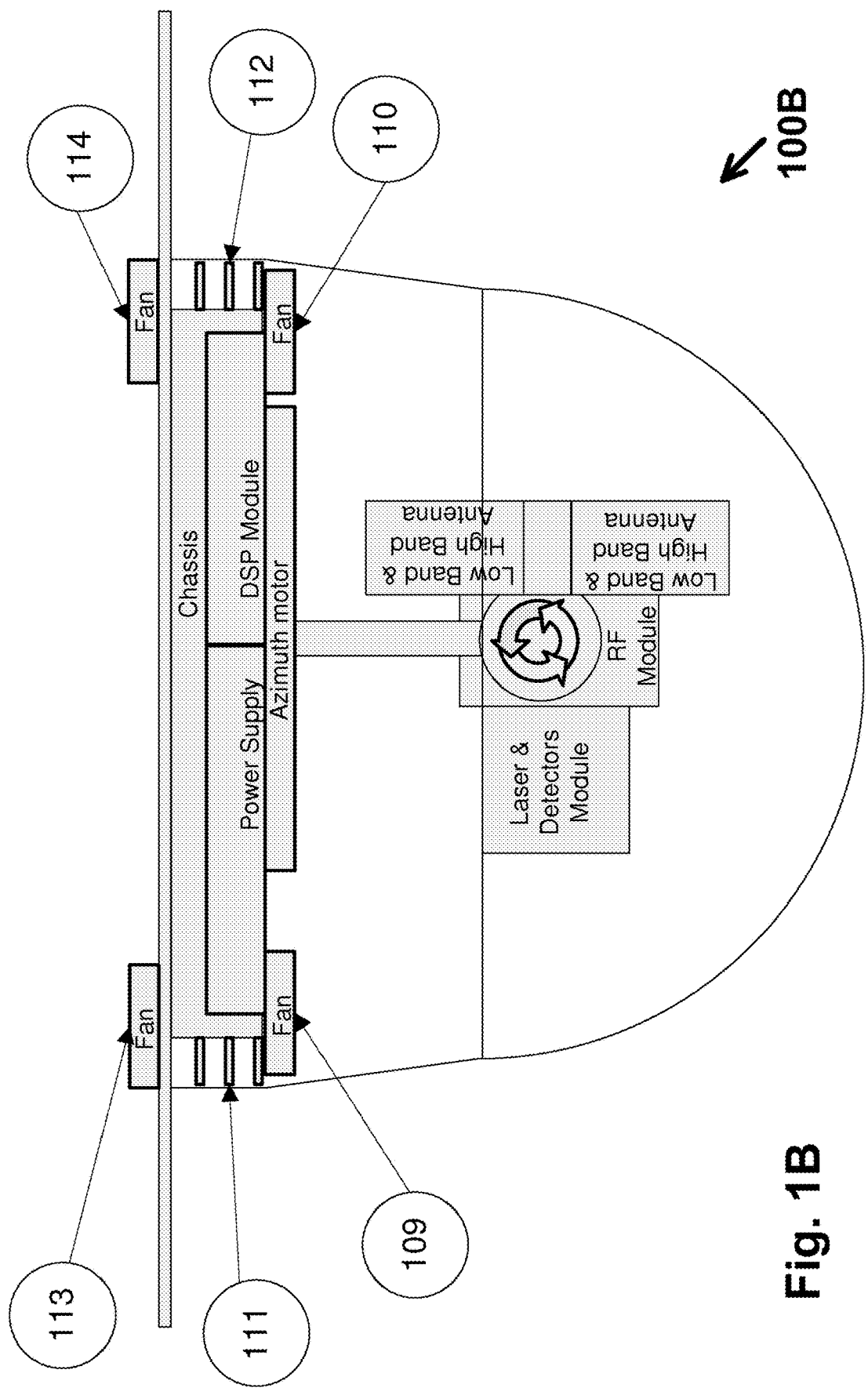
FIG. 1B is a schematic illustration of an aircraft protection system, further demonstrating thermal cooling and heat evacuation components, in accordance with some demonstrative embodiments of the present invention.

Reference is made to FIG. 1B, which is a schematic illustration of a Direct Infrared Countermeasure (DIRCM) unit 100B further demonstrating thermal cooling and heat evacuation components, in accordance with some demonstrative embodiments of the present invention.

For example, multiple internal fans 109 and 110 are used to remove or evacuate the heat waste from the DIRCM unit's volume to mechanical fins 111 and 112. The number of internal fans shown (109 and 110) is for demonstrative purposes only, and is not limited to two. The number of mechanical fans shown (111 and 112) is for demonstrative purposes only, and is not limited to three. Other suitable number of fans and/or fins may be used.

External fans 113 and 114 are used to remove or evacuate the heat waste from mechanical fins 111 and 112 to the outer space or to the external environment. The number of external fans shown (113 and 114) is for demonstrative purposes only, and is not limited to two.

Reference is made to FIG. 2 is a schematic illustration of a Direct Infrared Countermeasure (DIRCM) unit 200, in accordance with some demonstrative embodiments of the present invention.

A combined laser and detectors module 201 may comprise two or more laser emitters; for example, laser emitters 202, 203 and 204; as well one or more passive component(s) such as passive component / receiver 205; all integrated into a single, unified, module. The various active components (emitters 202-204) and/or passive component(s) 206, may operate using the same wavelength, or using different wavelengths.

Optionally, a controller 215, which may be an integral or internal component of the combined laser and detectors module 201 or may be external to it, may control and/or modify the operational properties of one or more of the components of the combined laser and detectors module 201, and particularly of one or more of components 202-206; for example, commanding or triggering such component(s) to turn on, turn off, activate, de-activate, setting or modifying a configuration parameter, setting or modifying a timing of operation or a time-length of operation, setting or modifying frequency or wavelength, or the like. The controller 215 may controlled independently and in a different manner each one of the controlled components 202-205, in order to implement or deploy a suitable and effective combination of countermeasure techniques based on sensed and/or collected and/or analyzed data, thereby improving the overall effectiveness of the DIRCM unit 200 in detecting the threat and neutralizing it or destroying it or otherwise responding to it.

One or more optical elements or optic elements, such as a prism 206 and a beam splitter 207, may be included in the combined laser and detectors module 201. Other suitable optical elements may be used, for example, a lens, a mirror, a curved mirror or lens, a concave mirror or lens, a convex mirror or lens, a reflecting element or reflective element, a refracting element or refractive element, a diffracting element, a dispersive element, a polarizing element, a deflecting element, a focusing element, a shape-modifying element, a beam-splitting element, a beam-combining element, a Gaussian to Top-Hat shape modifier, a superposition inducing element or superposition causing element, a prism, a wedge, a calibrating element, a calibrating wedge, an optical beam transformation element, or the like. Similarly, any other "optical element" or "optical component" that is described herein (with reference to any of the Figures), may comprise any one or more of the above-mentioned optical elements or a suitable combination thereof.

An optical window 208, optionally made of transparent or at least partially-transparent material(s), may enable outward pass-through of laser beam and/or other optical signal(s) and/or other electromagnetic radiation or emission(s) produced by the combined laser and detectors module 201; thereby operating at least as an optical exit window. In some embodiments, the optical window 208 may be utilized for one-way or single-directional passage of light or radiation, such as outwardly; whereas, in other embodiments, the optical window 208 may further allow selective entry and pass-through of incoming light or radiation or other electromagnetic signals, such as optical signals for acquisition or capturing by passive component 206 (e.g., a camera, an imager, an optical sensor).

A dual frequency RF module 209 may uniquely comprise an RF module aperture 210 to enable pass-through of laser beam(s) generated by a high-power laser transmitter (e.g., implemented as emitter 202 of the combined laser and detectors module 201), and/or to enable pass-through of exiting/outgoing optical beam(s) and/or entering/incoming optical signals, that pass through the RF module aperture 210. Such RF module aperture 210 may be implemented as a hole or tunnel or slit or opening within the dual frequency RF module 209; such that the electronic components of the dual frequency RF module 209 are structured around (or surrounding, or encapsulating, or encircling) the RF module aperture 210.

It is noted that in some embodiments, the dual frequency RF module 209 does not comprise any antenna or any RF antenna or any antenna wire or any antenna coil or any antenna spiral; and therefore, the dual frequency RF module 209 having the RF module aperture 210 is an antenna-free component having that unique pass-through structure; and the RF module aperture 210 may optionally be operably connected to or operably associated with a separate antenna.

A dual frequency band antenna 211 may receive or capture incoming RF signals for utilization or processing by the dual frequency RF module 209. In some embodiments, the dual frequency band antenna 211 is non-integral and/or non-internal to the dual frequency RF module 209, and these two components are two discrete components and not a unified component.

The dual frequency band antenna 211 comprises an antenna aperture 212 to enable pass-through of laser beam(s) generated by a high-power laser transmitter (e.g., implemented as emitter 202 of the combined laser and detectors module 201), and/or to enable pass-through of exiting/ outgoing optical beam(s) and/or entering/incoming optical signals, that pass through the antenna aperture 212. Such antenna aperture 212 may be implemented as a hole or tunnel or slit or opening within the dual frequency band antenna 211; such that the components (e.g., wires, metal structures, RF signal capturing structures) of the dual frequency band antenna 211 are structured around (or surrounding, or encapsulating, or encircling) the antenna aperture 212.

In some embodiments, the dual frequency band antenna 211 is constructed as a structure other than a coil or a spiral or an oval or a circle; or is structured as a non-circular, non-oval, non-elliptic, non-spiral, non-coil, structure. For example, the dual frequency band antenna 211 may be structured as a generally bagel-shaped or donut-shaped structure surrounding the antenna aperture 212, or as a cube or a box or other structure having the antenna aperture 212 therein; such that multiple (e.g., discrete, separate) RF signal receiving elements of the dual frequency band antenna 211 are scattered or located around the antenna aperture 212. For demonstrative purposes, the dual frequency band antenna 211 is depicted as comprising multiple such discrete Signal Receiving Elements (SREs) 221-224; other number of SREs may be used, and they may optionally be connected to each other or alternatively they may be entirely separate from each other yet belonging to the same single dual frequency band antenna 211.

It is clarified that the DIRCM unit 200 comprises a single component of "dual frequency RF module 209", and not two such components, even though FIG. 2 depicts two boxes labeled with "dual frequency RF module 209"; since FIG. 2 shows a cross-section of the DIRCM unit 200, and therefore the single component of "dual frequency RF module 209" which may be structured (for example) as a bagel-shaped or donut-shaped structure is shown as appearing twice, surrounding the RF module aperture 210.

It is clarified that the DIRCM unit 200 comprises a single component of "dual frequency band antenna 211", and not two such components, even though FIG. 2 depicts two boxes labeled with "dual frequency band antenna 211"; since FIG. 2 shows a cross-section of the DIRCM unit 200, and therefore the single component of "dual frequency band antenna 211" which may be structured (for example) as a bagel-shaped or donut-shaped structure is shown as appearing twice, surrounding the antenna aperture 212.

As mentioned above, a high-power laser transmitter may be implemented in the DIRCM unit 200; and this may be performed in various suitable ways. In some embodiments, emitter 202 may be or may comprise the high-power laser transmitter. In other embodiments, multiple emitters (e.g., emitters 202-204) may operate in concert to generate and output high-power laser transmission of laser beams. In other embodiments, a dedicated or separate high-power laser transmitter 216 may be part of the combined laser and detectors module 201, and the operational properties of such high-power laser transmitter 216 may be controlled, set or modified by the controller 215. In some embodiments, optionally, at least part of the high-power laser transmitter (e.g., at least its output-producing region or elements), or even an entirety of the high-power laser transmitter, may be implemented or structured to be physically within (e.g., inside, internally to) or adjacent to, or may protrude into, the aperture 210 and/or the aperture 212; thereby reducing the form-factor or the overall dimensions of the DIRCM unit 200.

In some embodiments, optionally, the dual frequency bands antenna 211 may be structured as, and/or may operate as, for example, a multi-layer patch antenna, a multi-layer patch antenna with stacked dipoles, or other suitable type(s) of antenna(s); or may be implemented as a combination or arrangement of two different types of antennas.

In some embodiments, the dual frequency bands antenna 211 may be divided into multiple regions or areas or zones or sub-units, for example, four quarters or four regions; which may be separate from each other, or may be non-touching one another, or may be inter-connected via wires and/or via mechanical connections. The division of the dual frequency bands antenna 211 into multiple (e.g., four) such regions may enable to implement a DIRCM unit that deploys multiple suitable techniques for threat detection, threat confirmation, threat verification, threat tracking, as well as fine and precise angular position determination in conjunction with the dual frequency RF module 209 using both low and high frequency bands. Such techniques may include, for example, amplitude comparison, phase comparison, or a combination of these and/or other techniques.

In some embodiments, the combination of both active components (202-204) and one or more passive components (216) as mechanically, electrically and optically jointly integrated components within the same combined laser and detectors module 201, may further enable real-time or near-real-time calibration of the DIRCM unit 200 while reducing optical and/or tracking errors and/or due to parallax effect, and/or may enable increased efficiency, increased accuracy, and/or increased effectiveness of the overall performance of the DIRCM unit 200 since its active and passive components are located within the same device and are in adjacent proximity to each other; such that if or when a first component detects a particular threat at a particular direction and distance, those parameters of direction and distance are similarly applicable to be utilized by a nearby or adjacent second component of the same combined laser and detectors module 201 and/or of the same DIRCM unit 200.

Furthermore, the structural combination or structural integration among (i) the passive component / receiver 205 of the combined laser and detectors module 201, and (ii) the dual frequency band RF module 209, and (iii) the dual frequency band antenna 211, which may be mechanically connected to each other or may be similarly integrated or implemented as a single unified component, may further be used real-time and/or near-real-time and/or online and/or offline calibration of the DIRCM unit 200, in order to further improve the DIRCM countermeasure efficiency or effectiveness or accuracy.

Figure 3:
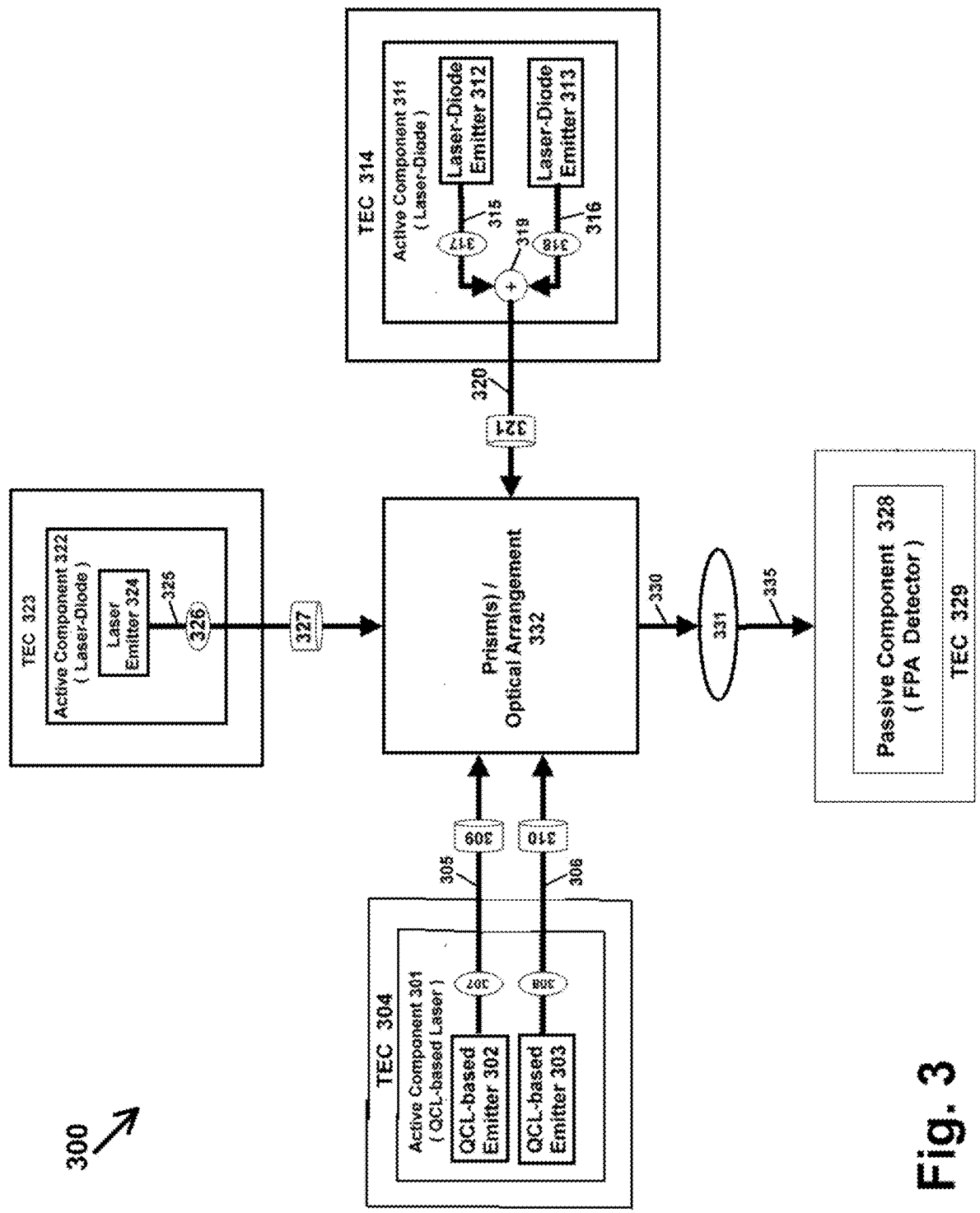
FIG. 3 is a schematic illustration of a laser module, in accordance with some demonstrative embodiments of the present invention.

Reference is made to FIG. 3, which is a schematic illustration of a laser module 300, in accordance with some demonstrative embodiments of the present invention. Laser module 300 may be a demonstrative implementation of a laser-based component or a laser emitter or a high-power laser transmitter, which may be part of a DIRCM unit or an IRCM unit or other aircraft protection system.

Laser module 300 may comprise one or more active threat-detecting components and/or one or more passive threat-detection components and/or one or more active threat-tracking components and/or one or more passive threat-tracking components and/or one or more active threat-countering components or countermeasure components. For demonstrative and non-limiting purposes, there are shown three active components (301, 311, 322) and one active component (328); however, some embodiments may comprise a different number and/or ratio and/or combination of such components.

Additionally or alternatively, the various components (301, 311, 322) may transmit signals and/or may receive signals at the same wavelength and/or at the same frequency; or alternatively at different values of wavelength and/or frequency. In some embodiments, two or more of the active components (301, 311, 322) may transmit signals at the same wavelength, for example in order to increase the total or the aggregate output power or output optical power that is generated and emitted from the lase module 300; whereas in other embodiments, two (or more) of the active components (301, 311, 322) may transmit signals at two (or more, respectively) different wavelengths, for example in order to increase the probability that at least one countermeasure will actually affect the incoming threat, and/or in order to increase the efficiency or effectiveness or coverage of the countermeasure capabilities of the DIRCM unit that the laser module 300 is part of.

In a demonstrative embodiment, active component 301 may be a laser transmitter or a high-power laser transmitter or a QCL-based laser transmitter or a QCL-based high-power laser transmitter, or other suitable laser transmitter or laser generator or laser unit able to generate and/or transmit laser beam(s). For example, the active component 301 may be a QCL-based laser unit, which may comprise one or more laser emitters, such as laser emitters 302 and 303, that emit one or more optical beams or laser beams, such as laser beams 305 and 306. Other number of laser emitters may be used; and other number of laser beams may be generated or emitted.

The active component 301 may further include, or may be connected to or may be in proximity to, one or more optical components such as optical elements 307 and 308, which may (i) modify one or more properties of the laser beams 305 and/or 306, and/or (ii) modify the shape(s) of laser beams 305 and/or 306 (e.g., from a natural Gaussian shape to a Top-Hat shape or to perform superposition of beams or of optically shifted Gaussian beams; or from the original first shape as outputted by laser emitters 302-303 to a second, different, modified, shape).

Optionally, optical elements 307 and 308, or another optical element which may be internal to the laser module 300 and/or may be internal to active component 301 (or conversely, may be internal to the laser module 300 but may be external to active component 301; such as a set of prism(s)/optical arrangement 332), or an optical assembly or optical arrangement, or a suitable set of two or more optical components which may be internal and/or external to active component 301, may combine the laser beams 305-306 into a single or unified or combined laser beam.

Active component 301 may be attached or connected, or mounted on, one or more thermo-electric cooling (TEC) unit(s) 304, in order to provide a direct and efficient cooling capability that may be required for the adequate and/or efficient operation (and particularly, the lasing or laser-emitting operations) of active component 301. Such TEC unit(s) 304 may utilize the Peltier effect to create a heat flux (e.g., at or between the junction of two different types of materials); and/or may comprise a Peltier cooler, a Peltier device, a Peltier heat pump, a solid-state refrigeration unit, a thermo-electric heat pump, a solid-state active heat pump which transfers heat from a first side of the device to the other side of the device (e.g., with consumption of electrical energy), or other suitable TEC unit(s) or TEC device(s).

The TEC unit(s) 304 may be structured or arranged in one or more suitable configurations; for example, a single TEC unit, a cascade or an array or a matrix of two or more TEC units (e.g., to optimize or to improve or to enhance their electrical properties), a multiple-layer or multi-layer TEC structure, a pyramid shaped TEC structure or an upside-down pyramid shaped TEC structure (e.g., each layer being a TEC unit), a cone-shaped or conical TEC structure, or other suitable configuration.

It is noted that for demonstrative purposes, the TEC unit(s) 304 are depicted in FIG. 3 as a "frame" which surrounds active component 301; however, in some embodiments, TEC unit(s) 304 need not necessarily be frame shaped, but rather, may have other suitable shape or structure; for example, in some demonstrative embodiments, TEC unit(s) 304 may be plate-shaped or plane-shaped, or may be a generally straight surface, or may be a curved structure or a three-dimensional structure having craters and/or protrusions, or may have fins or ribs or pins, or the like.

Optionally, one or more additional optical components, such as optical elements 309 and 310 (or other number of additional optical elements), may be placed or mounted or installed or connected externally to active component 301 yet internally to the laser module 300; for example, placed along the optical paths of laser beams 305 and/or 306. Such additional optical elements 309-310 may perform one or more optical functions and/or optical modifications to the already-generated or already-emitted laser beams 305 and/or 306, and particularly may perform a modification of one or more properties or optical properties of laser beams 305 and/or 306, and/or particularly may calibrate the laser beams 305 and/or 306 (e.g., by implementing the additional optical elements 309-310 as optical calibration elements or optical calibration wedges).

Active component 311 may be or may comprise a laser transmitter or a high-power laser transmitter, optionally implemented as a diode-based laser or a laser-diode unit or as an infrared (IR) laser diode unit or other suitable laser unit. Active component 311 may comprise one or more laser emitters, for example, two laser-diode emitters 312 and 313 that emit optical beams or laser beams 315 and 316 which then pass through optical elements 317 and 318 located within the active component 311.

In a demonstrative embodiment, active component 311 may be a laser transmitter or a high-power laser transmitter or a diode-based laser transmitter or a diode-based high-power laser transmitter, or an InfraRed (IR) diode-based laser transmitter or an InfraRed (IR) diode-based high-power level transmitter, or a laser-diode based unit or transmitter, or other suitable laser transmitter or laser generator or laser unit able to generate and/or transmit laser beam(s).

For example, the active component 311 may be a laser-diode unit or transmitter, which may comprise one or more diode-based or laser-diode based laser emitters, such as laser emitters 312 and 313, that emit one or more optical beams or laser beams, such as laser beams 315 and 316. Other number of laser emitters may be used; and other number of laser beams may be generated or emitted.

The active component 311 may further include, or may be connected to or may be in proximity to, one or more optical components such as optical elements 317 and 318, which may (i) modify one or more properties of the laser beams 315 and/or 316, and/or (ii) modify the shape(s) of laser beams 315 and/or 316 (e.g., from a natural Gaussian shape to a Top-Hat shape, or to perform superposition of beams or of optically shifted Gaussian beams; or from the original first shape as outputted by laser emitters 312-313 to a second, different, modified, shape).

Optionally, optical elements 317 and 318, or another optical element which may be internal to the laser module 300 and/or may be internal to active component 311 (or conversely, may be internal to the laser module 300 but may be external to active component 311; such as a set of prism(s)/optical arrangement 332), or an optical assembly or optical arrangement, or a suitable set of two or more optical components which may be internal and/or external to active component 311, and/or an optical combiner 319 or other optical adder element (e.g., which may be internal to laser module 311, and may be internal to the active component 311), may combine the laser beams 315-316 into a single or unified or combined laser beam 320, and/or may modify one or more properties of the laser beams 315-316 prior to their combining and/or during their combining and/or subsequent to their combining.

Optionally, an additional optical element 321 (e.g., an optical wedge, an optical calibration wedge, an optical calibration element, or the like) may be placed or installed or mounted nearby to the active component 311 or adjacent to the active component 311 or externally to the active component 311 (yet internally to the laser module 300), in order to calibrate the unified or combined laser beam 320. The additional optical element 321 may optionally perform one or more optical functions or optical modifications to the already-generated or already-emitted combined laser beam 320, and particularly may perform a modification of one or more properties or optical properties of combined laser beam 320, and/or particularly may calibrate the combined laser beam 320.

Active component 311 may be attached or connected, or mounted on, one or more thermo-electric cooling (TEC) unit(s) 314, in order to provide a direct and efficient cooling capability that may be required for the adequate and/or efficient operation (and particularly, the lasing or laser-emitting operations) of active component 311. Such TEC unit(s) 314 may utilize the Peltier effect to create a heat flux (e.g., at or between the junction of two different types of materials); and/or may comprise a Peltier cooler, a Peltier device, a Peltier heat pump, a solid-state refrigeration unit, a thermo-electric heat pump, a solid-state active heat pump which transfers heat from a first side of the device to the other side of the device (e.g., with consumption of electrical energy), or other suitable TEC unit(s) or TEC device(s).

The TEC unit(s) 314 may be structured or arranged in one or more suitable configurations; for example, a single TEC unit, a cascade or an array or a matrix of two or more TEC units (e.g., to optimize or to improve or to enhance their electrical properties), a multiple-layer or multi-layer structure, a pyramid shaped TEC structure or an upside-down pyramid shaped TEC structure (e.g., each layer being a TEC unit), a cone-shaped or conical TEC structure, or other suitable configuration.

It is noted that for demonstrative purposes, the TEC unit(s) 314 are depicted in FIG. 3 as a "frame" which surrounds active component 311; however, in some embodiments, TEC unit(s) 314 need not necessarily be frame shaped, but rather, may have other suitable shape or structure; for example, in some demonstrative embodiments, TEC unit(s) 314 may be plate-shaped or plane-shaped, or may be a generally straight surface, or may be a curved structure or a three-dimensional structure having craters and/or protrusions, or may have fins or ribs or pins, or the like.

In a demonstrative embodiment, active component 322 may be a laser transmitter or a high-power laser transmitter or a diode-based laser transmitter or a diode-based high-power laser transmitter, or an InfraRed (IR) diode-based laser transmitter or an InfraRed (IR) diode-based high-power level transmitter, or a laser-diode based unit or transmitter, or a visible wavelengths laser transmitter or visible wavelengths laser-diode or laser-based unit or transmitter, or other suitable laser transmitter or laser generator or laser unit able to generate and/or transmit laser beam(s).

For example, the active component 321 may be an additional laser-diode unit or transmitter, which may comprise one or more laser-diode based laser emitters emitting in the same or different optical wavelengths, such as laser emitter 324, that emit one or more optical beams or laser beams, such as laser beam 325. Other number of laser emitters may be used; and other number of laser beams may be generated or emitted.

The active component 311 may further include, or may be connected to or may be in proximity to, one or more optical components such as optical element 326, which may (i) modify one or more properties of the laser beams 325, and/or (ii) modify the shape of laser beams 325 (e.g., from a natural Gaussian shape to a Top-Hat shape, or by performing perform superposition of beams or of optically shifted Gaussian beams; or from the original first shape as outputted by laser emitters 324 to a second, different, modified, shape).

Optionally, optical element 326, or another optical element which may be internal to the laser module 300 and/or may be internal to active component 322 (or conversely, may be internal to the laser module 300 but may be external to active component 322; such as set of prism(s) / optical arrangement 332), or an optical assembly or optical arrangement, or a suitable set of two or more optical components which may be internal and/or external to active component 322, may perform such optical modification operations, and/or may modify one or more properties of the laser beam 325.

Optionally, an additional optical element 327 (e.g., an optical wedge, an optical calibration wedge, an optical calibration element, or the like) may be placed or installed or mounted nearby to the active component 322 or adjacent to the active component 322 or externally to the active component 322 (yet internally to the laser module 300), in order to calibrate the laser beam 325. The additional optical element 321 may optionally perform one or more optical functions or optical modifications to the calibrated laser beam, during such calibration or immediately before such calibration or immediately after such calibration.

Active component 322 may be attached or connected, or mounted on, one or more thermo-electric cooling (TEC) unit(s) 323, in order to provide a direct and efficient cooling capability that may be required for the adequate and/or efficient operation (and particularly, the lasing or laser-emitting operations) of active component 322. Such TEC unit(s) 323 may utilize the Peltier effect to create a heat flux (e.g., at or between the junction of two different types of materials); and/or may comprise a Peltier cooler, a Peltier device, a Peltier heat pump, a solid-state refrigeration unit, a thermo-electric heat pump, a solid-state active heat pump which transfers heat from a first side of the device to the other side of the device (e.g., with consumption of electrical energy), or other suitable TEC unit(s) or TEC device(s).

The TEC unit(s) 323 may be structured or arranged in one or more suitable configurations; for example, a single TEC unit, a cascade or an array or a matrix of two or more TEC units (e.g., to optimize or to improve or to enhance their electrical properties), a multiple-layer or multi-layer TEC structure, a pyramid shaped TEC structure or an upside-down pyramid shaped TEC structure (e.g., each layer being a TEC unit), a cone-shaped or conical TEC structure, or other suitable configuration.

It is noted that for demonstrative purposes, the TEC unit(s) 323 are depicted in FIG. 3 as a "frame" which surrounds active component 322; however, in some embodiments, TEC unit(s) 323 need not necessarily be frame shaped, but rather, may have other suitable shape or structure; for example, in some demonstrative embodiments, TEC unit(s) 323 may be plate-shaped or plane-shaped, or may be a generally straight surface, or may be a curved structure or a three-dimensional structure having craters and/or protrusions, or may have fins or ribs or pins, or the like.

In some embodiments, the beams, optical beams, laser beams, and/or other optical signals that are produced or outputted by active components 301, 311 an 322, may optionally pass through (or, may be directed towards) a set of prism(s)/optical arrangement 332; which may comprise, for example, a single prism, a set or array or matrix or batch of prisms, an arrangements or assembly of one or more prisms and/or lenses and/or mirrors and/or optical elements; which may, for example, combine the multiple optical beams or laser beams in to a single, unified, or combined optical beam or laser beam, and/or may perform optical modification of optical properties of such beams prior to their combining and/or during their combining and/or subsequent to their combining. As a non-limiting example, the set of prism(s)/optical arrangement 332 may output a single beam 330; or, in some embodiments, multiple beams or multiple laser beams or multiple optical beams.

Optionally, an optical element 331 may further modify one or more of the optical properties of the beam 330 that is outputted by the set of prism(s)/optical arrangement 332. For example, optical element 331 may include one or more lenses, optical wedge, optical calibration wedges, optical calibration element(s), optical beam transformation element(s), or other suitable optical components. The modified beam(s) 335 outputted by (or exiting from) the optical elements 331 may reach, or may pass through or into, or may be directed towards, the passive component 328.

In some embodiments, passive component 328 may be or may comprise, for example, a focal point array (FPA) detector or an FPA sensor that may operate at infrared (IR) wavelength and/or ultraviolet (UV) wavelength and/or visible wavelength and/or at other spectrum segment(s), wavelength values and/or frequency values.

The passive component 328 receives the modified beam(s) 335 from the optical element 331, and perform threat identification, further threat confirmation and/or threat verification, and determination of threat accurate angular position information that is provided in order to move or spin or rotate or gimbal the whole DIRCM unit and/or particularly the active components (301, 311 and/or) 322 towards the threat angular position for countermeasure optimization and for effective counter-measuring of the threat.

Passive component 328 may be attached or connected, or mounted on, one or more thermo-electric cooling (TEC) unit(s) 329, in order to provide a direct and efficient cooling capability that may be required for the adequate and/or efficient operation of passive component 328. Such TEC unit(s) 329 may utilize the Peltier effect to create a heat flux (e.g., at or between the junction of two different types of materials); and/or may comprise a Peltier cooler, a Peltier device, a Peltier heat pump, a solid-state refrigeration unit, a thermo-electric heat pump, a solid-state active heat pump which transfers heat from a first side of the device to the other side of the device (e.g., with consumption of electrical energy), or other suitable TEC unit(s) or TEC device(s).

The TEC unit(s) 329 may be structured or arranged in one or more suitable configurations; for example, a single TEC unit, a cascade or an array or a matrix of two or more TEC units (e.g., to optimize or to improve or to enhance their electrical properties), a multiple-layer or multi-layer structure, a pyramid shaped TEC structure or an upside-down pyramid shaped TEC structure (e.g., each layer being a TEC unit), a cone-shaped or conical TEC structure, or other suitable configuration.

It is noted that for demonstrative purposes, the TEC unit(s) 329 are depicted in FIG. 3 as a "frame" which surrounds passive component 328; however, in some embodiments, TEC unit(s) 329 need not necessarily be frame shaped, but rather, may have other suitable shape or structure; for example, in some demonstrative embodiments, TEC unit(s) 329 may be plate-shaped or plane-shaped, or may be a generally straight surface, or may be a curved structure or a three-dimensional structure having craters and/or protrusions, or may have fins or ribs or pins, or the like.

It is noted that optical elements 309, 310, 321 and/or 327 may be placed before the prism 332, or after the prism 332, or both before and after the prism 332, or instead of the prism 332, or in any other suitable combination or arrangement.

Figure 4:
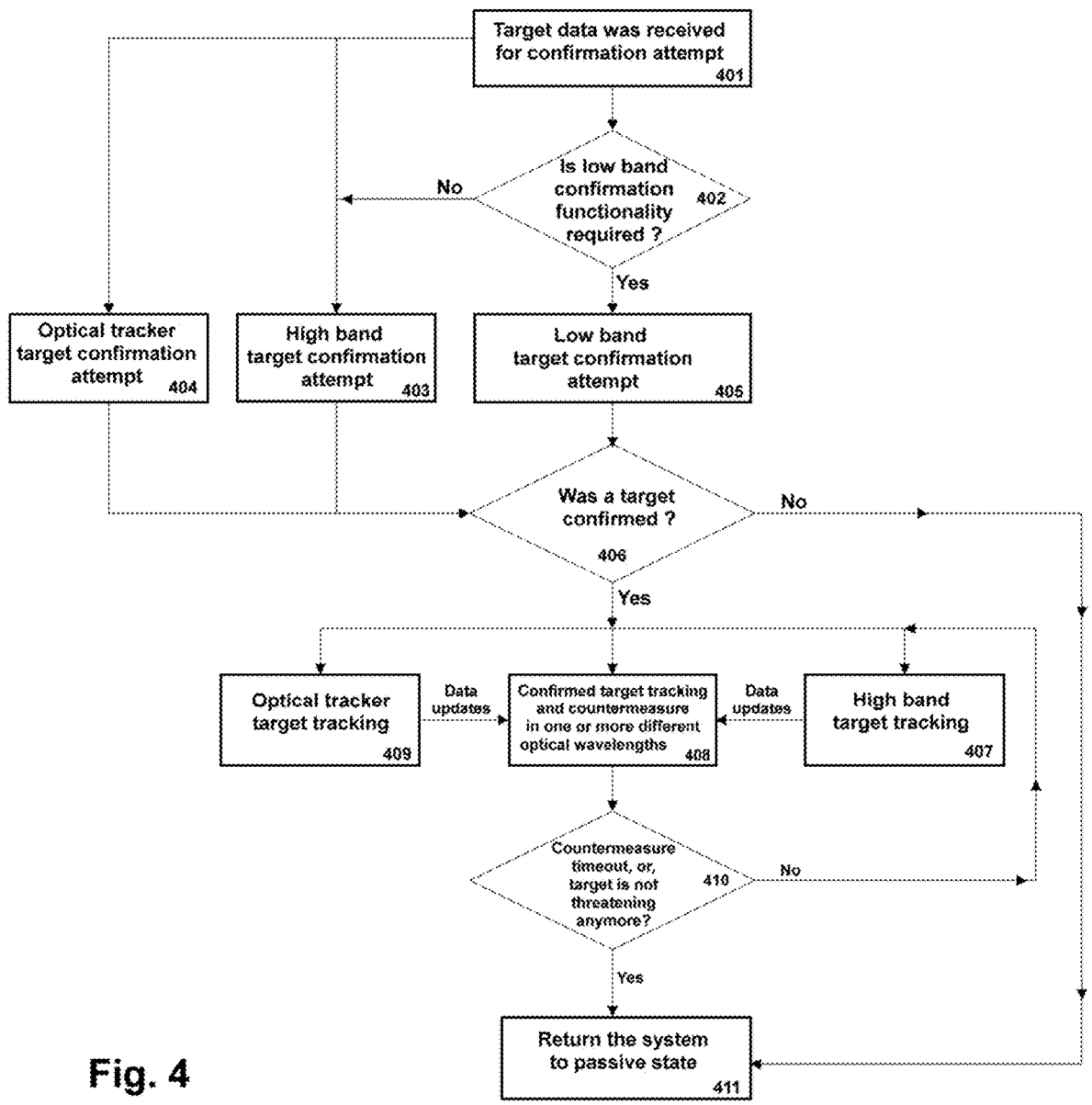
FIG. 4 is a flow-chart of a method, in accordance with some demonstrative embodiments of the present invention.

Reference is made to FIG. 4, which is a flow-chart of a method, in accordance with some demonstrative embodiments of the present invention. The method demonstrates, and/or may comprise or may utilize, target confirmation operations, target tracking operations, countermeasure deployment operations, lasing operations, and/or other suitable operations; and may be performed by an IRCM unit, a DIRCM unit, an aircraft protection unit or system, or other suitable devices or systems.

The term "target" as used herein may comprise, for example, a possible target, a possible threat, a not-yet-confirmed target or threat, a currently-tracked target or threat, an already-confirmed target or threat, a confirmed target or threat, a potential target or threat, a probable target or threat, an estimated target or threat, a sensed item or a detected item that may be or may not be a target or threat, or the like.

The term "threat data" as used herein may comprise, for example, one or more data-items or data-streams or other signals or indicator, which may be received, captured, acquired, sensed, imaged, processed and/or analyzed, particularly for the purpose(s) of detecting and/or confirming and/or tracking a threat or a target and/or for counter-measuring such target or threat.

In some embodiments, target data is received (block 410) or sensed or collected by the DIRCM unit or IRCM unit, or from one or more sensors and/or active detection units and/or passive detection units, for the purpose of performing threat confirmation or a threat confirmation attempt. The received data may comprise, for example, target angular position relatively to the DIRCM unit (or, relatively to the DIRCM unit installation onboard the aircraft), target optical data, radio frequency intensity of the target or related to the target or emitted by the target, target speed, target velocity, target direction of movement, target range, target distance, target type or target size (e.g., as estimated or determined based on analysis of images captured by an imager or camera or optical sensor; and/or as estimated or determined based on a heat signature or frequency signature or sound signature or acoustic signature that is sensed or detected from the target or threat), or other suitable data related to the threat or target, as well as (optionally) data regarding the aircraft in which the DIRCM unit is installed as such data may assist or may be utilized or may be taken into account for threat confirmation purposes (e.g., aircraft speed, aircraft air speed, aircraft velocity, aircraft flight direction, aircraft altitude, aircraft attitude, height of the aircraft, elevation data of the aircraft, number of concurrently incoming threats and/or number of other items that are confirmed threats or not-yet-confirmed threats (e.g., data from other DIRCM or IRCM units of the same aircraft), direction of already-confirmed threats, the number and/or type(s) of aircraft protection units or systems that are co-located with this DIRCM unit or IRCM unit or that are installed on the same aircraft as well as their current operational status (e.g., currently activated, currently de-activated, currently confirmed a threat, currently tracking a threat, currently deploying counter-measure(s), previously deployed counter-measure(s), or the like), angular coverage of the aircraft protection system(s) that are installed on this aircraft and/or that are currently operational, already-calculated threat parameters, or the like.

In some embodiments, a low band confirmation attempt or process may be activated or performed. For example, the DIRCM unit may determine (block 402) whether to activate to trigger, or initiate, or to perform the low band confirmation attempt using a low band target confirmation algorithm, based on analysis of the above-mentioned data; and such activation or performance may follow a positive determination result in block 402.

In some embodiments, a high band target confirmation attempt or process may be activated and performed (block 403); and/or an optical tracker target confirmation attempt or processes may be activated and performed (block 404); and/or an optional low band target confirmation attempt or process may be activated and performed (block 405).

In some embodiments, two or more, or some, or most, or all of the target confirmation attempts or target confirmation processes, of blocks 403, 404 and/or 405, may be performed in parallel, or concurrently, or simultaneously, or in a concurrent manner or a simultaneous manner, or in at least partially-overlapping time-periods, or at least partially concurrently or partially simultaneously, relative to each other; in order to shorten the overall time period required for threat confirmation, and/or in order to increase the probability of at least one of the various threat confirmation processes yielding a threat confirmation determination.

The execution of the high band target confirmation attempt (block 403) and the low band target confirmation attempt (block 405, if indeed activated based on the decision in block 402), may be performed by the dual frequency band RF module, in parallel to (or, at least partially simultaneously with or at least partially concurrently with) the optical tracker target confirmation attempt (block 404), thereby improving the DIRCM unit performance and/or efficiency; for example, by reducing or decreasing the time required until a confirmation decision is reached, by directly or indirectly causing decrease in threshold values utilized by one or more of the confirmation algorithms, by reducing or decreasing the rate of occurrences of "false alarms" or "false positive" determinations, by reducing or decreasing the rate of "false negative" determinations within a particular time-frame, and/or by providing other improvements or advantages to the overall efficiency or effectiveness of the DIRCM unit.

In some embodiments, optionally, the high band confirmation process (block 403) and/or the low band confirmation process (block 405) may further take into account or may further utilize, for example, data received from (or output produced by) the optical tracker process of block 404; which may be transferred or exchanged among these units or processes at pre-defined time intervals (e.g., every N seconds; every K milliseconds), and/or immediately upon producing a particular result or insight, or if a particular threshold value is reached by one of the processes or units. The exchanged data may comprise, for example, threat or target speed, threat or target velocity, threat or target direction of movement, threat or target range or distance, threat or target size, threat or target type, and/or other data.

Additionally or alternatively, the optical tracker process of block 404 may further take into account or may further utilize, for example, data received from (or output produced by) the high band confirmation process (block 403) and/or the low band confirmation process (block 405); which may be transferred or exchanged among these units or processes at pre-defined time intervals (e.g., every N seconds; every K milliseconds), and/or immediately upon producing a particular result or insight, or if a particular threshold value is reached by one of the processes or units. The exchanged data may comprise, for example, threat or target speed, threat or target velocity, threat or target direction of movement, threat or target range or distance, threat or target size, threat or target type, and/or other data.

The method may proceed to check (block 406) whether a target (e.g., a threat or an incoming threat) was confirmed by the results or the outputs from the one or more of the activated processes of blocks 403 and/or 404 and/or 405. This checking or determination of block 406 may be performed iteratively or substantially continuously or multiple times (e.g., every second, every N seconds, every K milliseconds, or the like), since each one of the different confirmation processes may require a different time-period for completion, and/or may provide its output at different time-point(s) relative to the other confirmation processes.

If the target has been confirmed, then: (i) the DIRCM unit may turn-off or deactivate the low band target confirmation process (if it was previously activated); and, (ii) a target tracking and countermeasure process is initiated or activated or triggered or performed, using one or more optical wavelengths (block 408). In parallel, or concurrently or simultaneously, a high band target tracking process may be performed (block 407) with regard to the already-confirmed target or threat, such as by the dual frequency band RF module; and the output of the high band target tracking process may continuously transfer (or, may send at pre-defined time intervals, such as every N seconds or every K milliseconds) data updates to the ongoing target tracking and countermeasure process of block 408. Additionally or alternatively, in parallel, or concurrently or simultaneously, an optical tracking process may be performed (block 409) with regard to the already-confirmed target or threat, such as by an optical tracker or optical sensor or imager or camera; and the output of the optical tracking process may continuously transfer (or, may send at pre-defined time intervals, such as every N seconds or every K milliseconds) data updates to the ongoing target tracking and countermeasure process of block 408. Accordingly, the target tracking and countermeasure process of block 408 may be continuously updated by, or may be fed with updated data from, the optical tracking process of block 407 and/or the high-band tracking process of block 407; as the target (e.g., the confirmed threat, or the confirmed incoming threat) may change its properties over time, may change its speed, velocity, direction, altitude, or the like.

Block 408 may further comprise the performing or the deployment of one or more counter-measure operations that are deployed against the confirmed threat which is being tracked. In some embodiments, different types of counter-measures are deployed in series, one type after another, to enable each counter-measure to operate without disrupting or affecting the operation of another counter-measure. In other embodiments, two or more types of counter-measures are deployed concurrently or simultaneously, in order to potentially reduce the time for eliminating or neutralizing the threat, and/or in order to achieve a combined or increased power by combining together multiple types of countermeasures, and/or in order to achieve a combined effect in which two different types of countermeasures succeed in the aggregate to eliminate or to neutralize the threat due to their deployment in concert.

In some embodiments, optionally, the high band target tracking process (block 407) may further take into account or may further utilize, for example, data received from (or output produced by) the optical tracker target tracking process of block 409; which may be transferred or exchanged among these units or processes at pre-defined time intervals (e.g., every N seconds; every K milliseconds), and/or immediately upon producing a particular result or insight, or if a particular threshold value is reached by one of the processes or units. The exchanged data may comprise, for example, threat or target speed, threat or target velocity, threat or target direction of movement, threat or target range or distance, threat or target size, threat or target type, and/or other data.

Additionally or alternatively, the optical tracker process of block 408 may further take into account or may further utilize, for example, data received from (or output produced by) the high band target tracking process of block 407; which may be transferred or exchanged among these units or processes at pre-defined time intervals (e.g., every N seconds; every K milliseconds), and/or immediately upon producing a particular result or insight, or if a particular threshold value is reached by one of the processes or units. The exchanged data may comprise, for example, threat or target speed, threat or target velocity, threat or target direction of movement, threat or target range or distance, threat or target size, threat or target type, and/or other data.

The method may proceed to check (block 410) whether the threat was neutralized or eliminated or destroyed, or whether the threat is no longer an incoming threat (e.g., a previously-approaching missile was diverted and is not travelling in a direction that is away from this aircraft), or whether the countermeasure performance time has reached a pre-defined threshold for time-out. The check may be performed iteratively, such as every N seconds or every K milliseconds, and may be part of the ongoing process of target tracking and counter-measuring. As long as there is a negative result in the checking of block 410, the DIRCM unit may proceed to iteratively and/or continuously perform the operations of blocks 407, 408 and/or 409. Conversely, upon a positive result in the checking of block 410, the DIRCM unit is returned or switched back to a passive state (block 411), such as, by (i) deactivating or terminating the ongoing threat tracking processes, and/or by (ii) deactivating or terminating any ongoing counter-measuring operations, and/or by (iii) determining to abort and not to perform further threat tracking operations or counter-measuring operations with regard to this particular threat.

Figure 5:
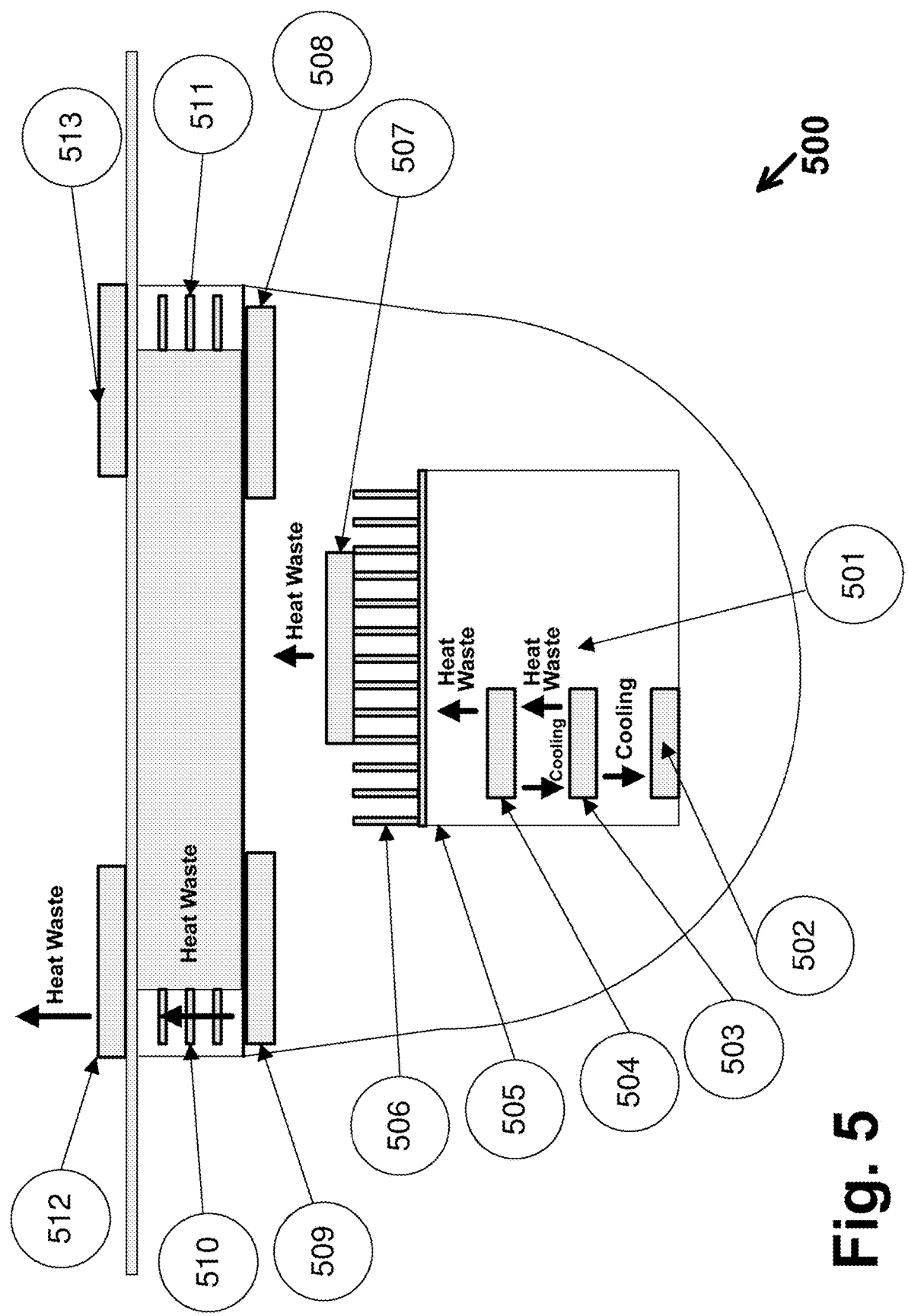
FIG. 5 is a schematic illustration of a DIRCM unit demonstrating cooling and heat-evacuation components, in accordance with some demonstrative embodiments of the present invention.

Reference is made to FIG. 5, which is a schematic illustration of a DIRCM unit 500 demonstrating cooling and heat-evacuation components, in accordance with some demonstrative embodiments of the present invention.

For example, laser module 501 may comprise multiple laser emitters and FPA detectors 502. The number of laser emitters and detectors that is shown is for illustration purposes only, and may be greater than one (e.g., demonstrated with reference to FIG. 3 above).

Laser emitter 502 is attached by its baseplate to the cold side of TEC 503, in order to cool the laser emitter 502 baseplate and subsequently cool the laser emitter semiconductor junction to the desired operational temperature.

TEC 503 hot side's accumulated heat waste is removed to the TEC 504 cold side in order to operate both TEC devices 503 and 504 at (or near) their optimal operating working point in terms of efficiency and required power consumption, and also to allow or to create a higher temperature difference between laser emitter 502 baseplate and the DIRCM unit's external environment temperature.

TEC 504 hot side's accumulated heat waste is removed to the heat sink 506, which may be constructed from one or more thermal conductive materials. The heat sink 506 may have a particular geometric or spatial or three-dimensional structure, to optimize its thermal performance while also reducing its weight or form-factor or footprint or spatial volume. A fan 507 is installed on top of the heat sink 506, and is used to cool it and remove the heat sink's 506 accumulated heat waste towards the DIRCM unit's internal volume that is defined by the DIRCM unit's dome or radome (e.g., as explained in FIG. 1A above).

Internal fans 508 and 509 are installed on or at the DIRCM unit's mechanical chassis, inside the radome; and are used to remove the accumulated heat waste to or towards the mechanical fins 510 and 511. The number of internal fans shown (508 and 509) is for illustration purposes only, and is not limited to three. The mechanical fins 510 and 511 may constructed from one or more thermal conductive materials. Mechanical fins 510 and 511 are used to remove the heat waste from DIRCM unit radome's internal volume (that is closed and sealed) to the DIRCM unit's external environment, and this is facilitated using external fans 512 and 513.

External fans 512 and 513 are installed or mounted or connected outside of the DIRCM unit's protective radome, in the external environment of the DIRCM unit. External fans 512 and 513 remove the heat waste from mechanical fins 508 and 509 to the DIRCM unit's external environment; and bring (i) the DIRCM unit's external environment temperature, and (ii) the DIRCM unit's radome internal temperature, to be as close as possible to each other (for example, in some implementations, within 0.5 or 1 or 2 or 3 or 5 degrees Celsius of difference between these two temperature values). The number of external fans 512 and 513 shown is for illustration purposes only, and is not limited to two.

Some embodiments of the present invention may thus comprise or utilize a particular cooling and heat-evacuation structure that is counter-intuitive and/or provides efficient operational results. For example, heat waste from the laser and detectors module, is not evacuated immediately or directly away from the aircraft, and/or is not evacuated immediately or directly away from the chassis of the DIRCM unit; but rather, it is initially evacuated inwardly towards the aircraft and/or towards the chassis of the DIRCM unit and/or inwardly towards the flat base of the protective radome (rather than towards the curved dome of the protective radome); and only then, by using additional mechanical fins in combination with internal fans and/or external fans, the heat waste is evacuated away from the protective radome and/or away from the aircraft and/or away from the chassis of the DIRCM unit and/or outwardly towards the external environment that externally surrounds the DIRCM unit or its protective radome. Additionally or alternatively, the unique inclusion of mechanical fins within the protective radome, and/or in their particular locations as demonstrated, and/or in combination with the fans within the protective radome, and/or in combination with the fans located externally to the protective radome, further provide a unique and counter-intuitive structure that provides efficient heat evacuation from the radome outwardly.

Figure 6:
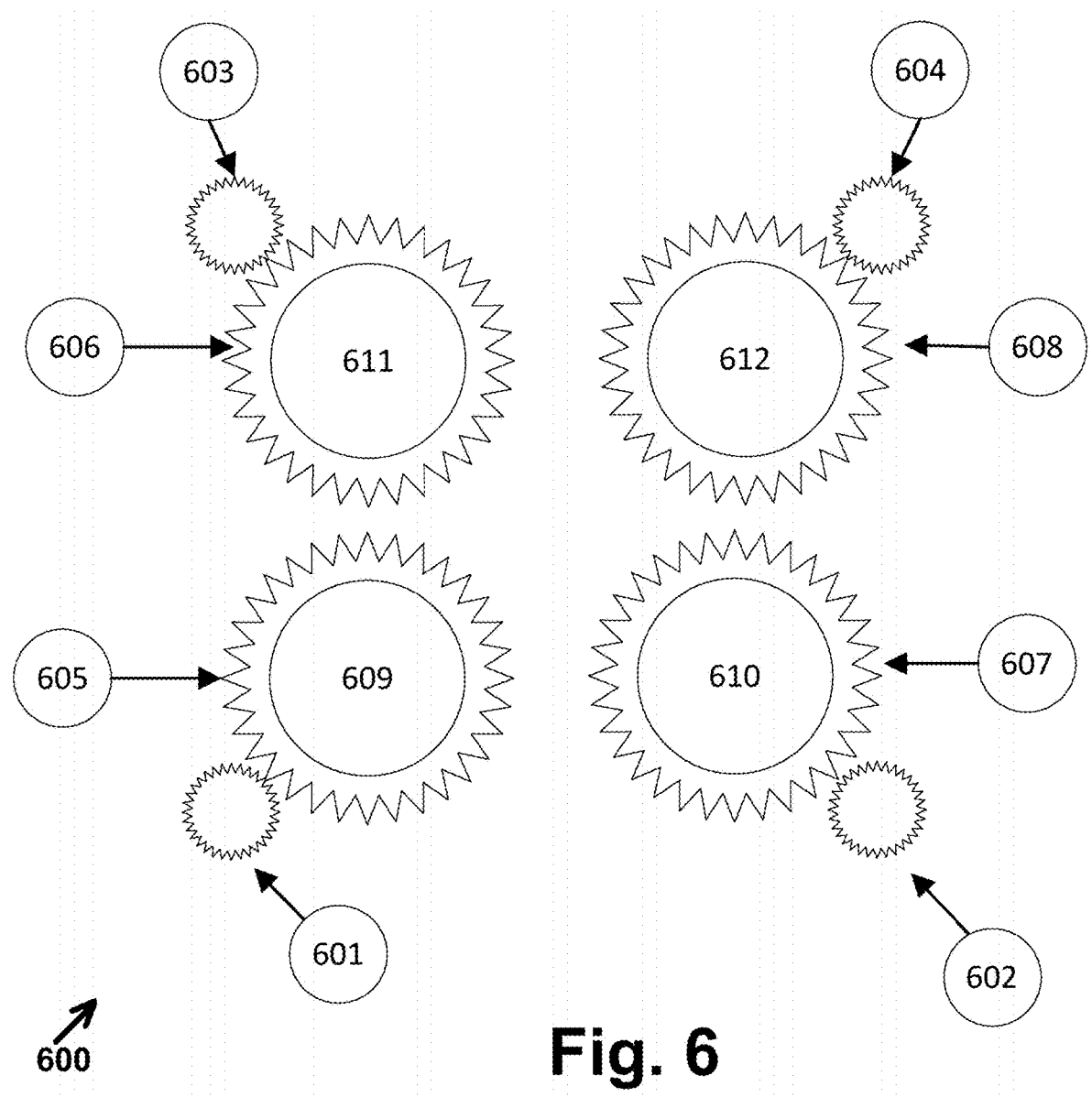
FIG. 6 is a schematic illustration demonstrating a laser module of a DIRCM unit and its calibration mechanism, which includes optical and mechanical elements, in accordance with some demonstrative embodiments of the present invention.

Reference is made to FIG. 6, which is a schematic illustration demonstrating a laser module 600 of a DIRCM unit and its calibration mechanism, which includes optical and mechanical elements, in accordance with some demonstrative embodiments of the present invention. The calibration mechanism may be utilized with each one of the emitting channels or elements that are mentioned or described in FIG. 3 above and/or in other figures.

Mechanical adjustment elements 601, 602, 603 and 604 may comprise, for example, screws that are tuned or fine-tuned or adjusted, using a mechanical screw which may turn or rotate or otherwise adjust the orientation or position or location or distance of the optical wedges and/or the optical wedges housings 605, 606, 607 and 608. The number of adjustment elements and optical wedges housings is for illustration purposes, and is not limited to four. Mechanical adjustment elements 601, 602, 603 and 604 may be implemented as geared elements, and optical wedges housings 605, 606, 607 and 608 may be implemented as geared elements.

The adjustment resolution or the adjustment characteristics (e.g., adjustment length, adjustment depth, number of rotations, or the like) may be calculated or determined from (or based on), for example, the gear ratio of each adjustment element 601, 602, 603 and 604 and its applicable or corresponding optical wedge housing 605, 606, 607 and 608. Each adjustment element (601-604) and its corresponding optical wedge housing (605-608) may be adjusted or modified independently of other adjustment elements and/or other optical wedge housing, which may have other or the same adjustment characteristics. Using this structure, a high-resolution calibration capability can be achieved for each laser emitter that is described in FIG. 3 above and/or in other figures.

Once calibrated, each mechanical adjustment elements is mechanically locked in its place, in order to avoid calibration loss during system operation period or due to mechanical shocks or vibrations of the system. Optionally, a mechanical locking element or locking mechanism may be utilized; for example, a nut, a bolt, a pin, an element that stops or prevents further rotation of the mechanical element, a gluing or bonding mechanism, a cover, a pressure mechanism, or the like.

Each one of optical wedges 609, 610, 611 and 612 is installed or mounted or placed inside the respective optical wedges housing 605, 606, 607 and 608. The optical wedges are used in order to calibrate each optical beam that is described in FIG. 3 above. Each optical wedge 609, 610, 611 and 612 may have a symmetric, or non-symmetric, or any other geometric type or shape or characteristics, in order to properly calibrate the applicable optical beams that are outputted from the laser emitters or that exit the laser emitters.

Optical wedges 609, 610, 611 and 612 may be constructed as single layer optical elements, or as multi-layer optical elements.

In some embodiments, a DIRCM unit may comprise, for example, (A) a dual frequency Radio Frequency (RF) module, comprising: (A1) a dual-band RF transmitter and a dual-band RF receiver, to transmit and receive high-band RF signals and low-band RF signals; and (A2) a threat confirmation and tracking module, to confirm and track a possible incoming threat based on processing of high-band RF signals and low-band RF signals received by the dual-band RF receiver. The DIRCM unit may further comprise, (B) a dual frequency band antenna, to transmit and receive the high-band RF signals and the low-band RF signals; and (C) a directed high-power laser transmitter, to activate a directed high-power optical countermeasure (e.g., high-power laser beam(s)) towards a precise angular position of a confirmed threat.

In some embodiments, DIRCM unit comprises a high-power laser module or other laser module, which comprises: (a) a laser transmitter that comprises one or more Quantum Cascade Laser (QCL) based laser emitters, which produce laser beam/s and/or optical output power that is combined within the laser transmitter or externally to it by using one or more optical elements for combining optical signals and/or laser beams; and (b) one or more laser transmitters that are based on laser-diode laser emitters, that emit laser beams and/or optical output in one or more Infra-Red (IR) wavelengths and/or visible and/or any other applicable wavelengths, and which produce laser beam/s and/or optical output power that is combined within the laser transmitter or externally to it by using one or more optical elements for combining optical signals and/or laser beams; and optionally also (c) an optical Focal Point Array (FPA) detector or sensor, that receives an incoming optical signal that is incoming from (or, is reflected from, or is emitted from) the target or threat, wherein the incoming optical signal is at infrared (IR) or visible or any other applicable wavelength, and wherein the optical FPA detector or sensor analyzes or processes the incoming optical signal to generate one or more insights regarding one or more characteristics of the target or threat.

In some embodiments, the DIRCM unit or the aircraft protection system comprises a controller or processor or other logic unit, that performs and optimizes the confirmation, tracking and countermeasure functions against a threat, based on real-time (or near-real-time) data that is analyzed and exchanged between (i) a dual frequency RF module, and a (ii) laser module having an optical FPA detector; wherein the exchanged data comprises one or more of: (a) threat distance or threat range, (b) threat velocity, (c) estimated physical size of the threat.

In some embodiments, the DIRCM unit or the aircraft protection system comprises a (i) a dual frequency RF module, and a (ii) laser module having an optical FPA detector; wherein both component (i) and component (ii) share the same (e.g., single, common, unified) mechanical aperture or optical aperture, the same electronics infrastructure or components, and/or joint algorithms or co-operating algorithms to identify the threat by using two (or more) different electro-magnetic and electro-optic spectral ranges and/or by utilizing two different methods of threat identification (e.g., electro-magnetic; electro-optic).

In some embodiments, the DIRCM unit (or the aircraft protection system) may comprise a Middle Wave Infra-Red (MWIR) QCL-based laser transmitter, that includes one or more Quantum Cascade Laser (QCL) based laser emitters, which produce one or more laser beams or optical beams that are modified (using one or more optical elements) from being natural Gaussian shaped to being (i) Top Hat shaped, or (ii) superposition of multiple natural Gaussian beams with an offset, or (iii) superposition of multiple natural Gaussian beams without an offset, thereby improving or enhancing the effectiveness of the countermeasure effectiveness of the DIRCM unit.

Additionally or alternatively, the DIRCM unit (or the aircraft protection system) may comprise (I) a Middle Wave Infra-Red (MWIR) laser-diode based laser transmitter, or (II) a Short-Wave Infra-Red (SWIR) laser-diode based laser transmitter, or (III) a visible-light laser-diode based laser transmitter (e.g., which emits or produces a visible laser-beam which is visible to the human eye); wherein each one of them may comprise one or more laser-diode based laser emitters; wherein such laser emitters produce one or more laser beams or optical beams that are modified (using one or more optical elements) from being natural Gaussian shaped to being (i) Top Hat shaped, or (ii) superposition of multiple natural Gaussian beams with an offset, or (iii) superposition of multiple natural Gaussian beams without an offset, thereby improving or enhancing the effectiveness of the countermeasure effectiveness of the DIRCM unit.

In some embodiments, the DIRCM unit or the aircraft protection system comprises one or more QCL-based laser transmitters and/or laser-diode laser transmitters, that are installed in the laser module; wherein each such laser transmitter may comprise one or more laser emitters. The laser beams and/or optical beams that are produced by such laser transmitters, are combined inside the laser module using one or more optical elements (e.g., optical combiner; optical adder; prism), order to reduce the number of optical paths of (or within) the laser module, and/or to decrease the number of optical elements that are required, and/or to improve the countermeasure effectiveness of the DIRCM unit or the aircraft protection system.

In some embodiments, one or more thermoelectric coolers (TEC) units are attached to the QCL-based laser transmitter(s) and/or to the laser-diode based laser transmitter(s) and/or to the passive/optical FPA detector. Optionally, the TEC units are installed together in a cascade mode or in a cascade structure, or in another structure or pattern that improves or optimizes the overall efficiency of the TEC units and/or that improves their heat dissipation capabilities and/or that reduces the required space or form-factor.

In some embodiments, the DIRCM unit may feature a unique thermal evacuation architecture or structure which efficiently removes the heat that is produced by (or absorbed by) the TEC units of the laser module; for example, by including one or more heat sinks, fans, fins, ribs, protruding elements, material isolators, thermal isolation units, and/or other passive and/or active heat evacuation components; to thereby improve the countermeasure effectiveness of the DIRCM unit.

In some embodiments, the DIRCM unit itself may integrally comprise within it an optical Focal Point Array (FPA) detector or sensor, which is integrated or installed integrally within the laser module of the DIRCM unit, in order to further improve the DIRCM unit countermeasure effectiveness, by increasing the DIRCM unit's tracking accuracy and/or by reducing the optical error between the laser module's components (e.g., between active and passive components), while also remaining within the same physical properties and/or form-factor and/or foot-print of the DIRCM unit.

In some embodiments, the DIRCM unit comprises (i) one or more QCL-based laser transmitters, and/or (ii) one or more laser-diode based transmitters, and further comprises (iii) a passive optical FPA detector or sensor; wherein the laser transmitters and the passive optical FPA detector produce or utilize (respectively) optical signals that are divided and/or combined using one or more optical elements, and use the same (e.g., single, unified, common) optical exit path; in order to reduce the overall optical errors of the components of the DIRCM unit, and/or to reduce the physical properties and/or footprint and/or form factor of the laser module and/or the DIRCM unit, and/or to improve the countermeasure effectiveness of the DIRCM unit.

In some embodiments, the DIRCM unit may comprise: (a1) one or more QCL-based laser transmitters, and/or (a2) one or more laser-diode based laser transmitters; and also (b) a passive optical FPA detector; wherein these components are installed or integrated together inside or within a single high-power laser transmitter unit. In some embodiments, (i) the laser beams or optical signals outputted by the laser transmitters, and (ii) the optical signals incoming to the passive optical FPA detector, are separated from each other, for example, in frequency domain (e.g., different wavelength of signals) and/or in time domain (e.g., different time-slots) and/or using physical separation of signals (e.g., using one or more optical elements that are placed along the relevant optical path(s) and that move or route or divert or block or otherwise selectively modify some or all of the optical signals and/or laser beams).

In some embodiments, each QCL-based laser transmitter and/or each laser-diode laser transmitter is controlled and/or activated independently and/or separately from other laser emitter(s), to enable the DIRCM unit to transmit or to utilize multiple, different, countermeasure techniques at the same time and/or at least partially concurrently, thereby improving the overall countermeasure effectiveness of the DIRCM unit.

In some embodiments, lenses are installed as an integral part of the enclosure(s) of the laser emitter(s), to reduce the overall optical errors, and/or to reduce the laser module's physical properties and/or footprint and/or form-factor, and/or to improve the countermeasure effectiveness of the DIRCM unit.

In some embodiments, at least part of the laser module or the high-power laser module, or more than 50% of the overall size of laser module or the high-power laser module, or an entirety of the laser module or the high-power laser module, is installed or is integrated inside or within the dual frequency RF module and dual frequency band antenna; in order to improve the capabilities of the high power laser emitter, in order to reduce footprint or form-factor, and/or to reduce the physical properties of the DIRCM unit.

In some embodiments, one or more of the laser transmitters and/or the passive optical FPA detector, that are installed within the same high-power laser module, are further utilized for real-time and/or offline calibration purposes, to improve the countermeasure effectiveness of the DIRCM unit; for example, by lasing on (or towards) a known or pre-defined object (e.g., whose location is known), using QCL-based laser transmitter(s) and/or laser-diode based laser transmitter(s), and measuring the lasing reflected signal using the passive optical FPA detector. In some embodiments, such calibration may be performed by using one or more optical wavelengths, using one or more narrow-width laser beam transmitters and a passive optical FPA detector that may operate in different optical wavelengths. Furthermore, in some embodiments, usage of more than one optical wavelength for calibration, may further increase the calibration accuracy or efficiency.

In some embodiments, the system or the DIRCM unit may further comprise a gimbaling mechanism to gimbal the directed high-power laser transmitter towards said threat. Optionally, in some embodiments, the directed high-power laser transmitter commences to emit laser beams prior to being directed towards said threat; for example, in order to save a warming-up time-period that may be required for said directed high-power laser transmitter between its receipt of a command to emit laser beams and its actual emission of laser beams and/or increase the countermeasure effectiveness while the gimbal in movement is in its final stages of moving or rotating or spinning or elevating or otherwise changing the position or orientation or direction of the DIRCM or IRCM unit.

In some embodiments, the system or the DIRCM unit is encapsulated in or is housed in (or is implemented as) a stand-alone Line-Replaceable Unit (LRU) housing or encapsulation (or, a lower line replaceable unit (LLRU), or a line-replaceable component (LRC), or a line-replaceable item (LRI), or other modularly replaceable component) to enable rapid and modular mounting and dismounting and/or replacement of the system relative to said aircraft. For example, the DIRCM or IRCM unit, in some embodiments, may be comprised in a LRU-housing, or may be implemented within a LRU-housing or LRU-encapsulation; and the various components of module of the DIRCM or IRCM unit may be integrally implemented within such LRU-compatible housing or encapsulation, and may be wired or hard-wired therein in a manner that enables rapid mechanical and/or electronic mounting and dismounting of the DIRCM or IRCM unit relative to the aircraft that it is intended to protect. This particular structure may enable utilization of the DIRCM or IRCM unit of the present invention in military or combat scenarios, in which rapid deployment or replacement may be required.

Some implementations of the present invention may operate in conjunction with, or may utilize, one or more devices or methods described in U.S. Pat. No. 9,109,862, titled "System, Device, and Method of Protecting Aircrafts Against Incoming Threats", which is hereby incorporated by reference in its entirety.

Some implementations of the present invention may operate in conjunction with, or may utilize, one or more devices or methods described in U.S. Pat. No. 8,672,223, titled "System, Device, and Method of Protecting Aircrafts Against Incoming Missiles and Threats", which is hereby incorporated by reference in its entirety.

Some implementations of the present invention may operate in conjunction with, or may utilize, one or more devices or methods described in U.S. Pat. No. 8,258,998, titled "Device, System, and Method of Protecting Aircrafts Against Incoming Threats", which is hereby incorporated by reference in its entirety.

The present invention may include a system for protecting an aircraft against a threat, the system comprising: (A) a dual frequency Radio Frequency (RF) module, comprising: (A1) a dual-band RF transmitter and a dual-band RF receiver, to transmit and receive high-band RF signals and low-band RF signals; and (A2) a threat confirmation and tracking module, to confirm and track a possible incoming threat based on processing of high-band RF signals and low-band RF signals received by the dual-band RF receiver; (B) a dual frequency band antenna, to transmit and receive the high-band RF signals and the low-band RF signals; (C) a directed high-power laser transmitter, to activate a directed high-power laser beam as countermeasure towards a precise angular position of a confirmed threat.

In some embodiments, the directed high-power laser transmitter is implemented as a high-power laser module which comprises: (a) a laser transmitter that comprises one or more Quantum Cascade Laser (QCL) based laser emitters, which produce laser beams and/or optical output power that is combined within the laser transmitter by using one or more optical elements for combining optical signals and/or laser beams; (b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined within said set of one or more laser transmitters by using one or more optical elements for combining optical signals and/or laser beams.

In some embodiments, the directed high-power laser transmitter is implemented as a high-power laser module which comprises: (a) a laser transmitter that comprises one or more Quantum Cascade Laser (QCL) based laser emitters, which produce laser beams and/or optical output power that is combined internally to said high-power laser module but externally to the laser transmitter by using one or more optical elements for combining optical signals and/or laser beams; (b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined internally to said high-power laser module but externally to said set of one or more laser transmitters by using one or more optical elements for combining optical signals and/or laser beams.

In some embodiments, the directed high-power laser transmitter is implemented as a high-power laser module which comprises: (a) a laser transmitter that comprises one or more Quantum Cascade Laser (QCL) based laser emitters, which produce laser beams and/or optical output power that is combined within the laser transmitter by using one or more optical elements for combining optical signals and/or laser beams; (b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined within said set of one or more laser transmitters by using one or more optical elements for combining optical signals and/or laser beams.

In some embodiments, the directed high-power laser transmitter is implemented as a high-power laser module which comprises: (a) a laser transmitter that comprises one or more Quantum Cascade Laser (QCL) based laser emitters, which produce laser beams and/or optical output power that is combined internally to said high-power laser module but externally to the laser transmitter by using one or more optical elements for combining optical signals and/or laser beams; (b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined internally to said high-power laser module but externally to said set of one or more laser transmitters by using one or more optical elements for combining optical signals and/or laser beams; (c) an optical Focal Point Array (FPA) detector, that receives an incoming optical signal that is incoming from said threat, wherein the incoming optical signal is at infrared (IR) or at visible light wavelength, and wherein the optical FPA detector analyzes the incoming optical signal to generate one or more insights regarding one or more characteristics of the threat.

In some embodiments, the system comprises: a processor that performs confirmation, tracking and countermeasure functions against said threat, based on real-time data that is analyzed and exchanged between (i) a dual frequency RF module, and a laser module having an optical FPA detector; wherein the exchanged data comprises one or more of: (a) threat distance or threat range, (b) threat velocity, (c) estimated physical size of the threat.

In some embodiments, the system comprises: a processor that performs confirmation, tracking and countermeasure functions against said threat, based on real-time data that is analyzed and exchanged between (i) a dual frequency RF module, and a laser module having an optical FPA detector; wherein the exchanged data comprises one or more of: (a) threat distance or threat range, (b) threat velocity, (c) estimated physical size of the threat; wherein real-time data that is generated by said dual frequency RF module, is transferred to, and modifies the operation of, said laser module having an optical FPA detector.

In some embodiments, the system comprises: a processor that performs confirmation, tracking and countermeasure functions against said threat, based on real-time data that is analyzed and exchanged between (i) a dual frequency RF module, and a laser module having an optical FPA detector; wherein the exchanged data comprises one or more of: (a) threat distance or threat range, (b) threat velocity, (c) estimated physical size of the threat; wherein real-time data that is generated by said laser module having an optical FPA detector is transferred to, and modifies the operation of, said dual frequency RF module.

In some embodiments, the system comprises: a Middle Wave Infra-Red (MWIR) QCL-based laser transmitter, that includes one or more Quantum Cascade Laser (QCL) based laser emitters, which produce one or more laser beams that are modified using one or more optical elements from being natural Gaussian shaped to being Top Hat shaped.

In some embodiments, the system comprises: a Middle Wave Infra-Red (MWIR) QCL-based laser transmitter, that includes one or more Quantum Cascade Laser (QCL) based laser emitters, which produce one or more laser beams that are modified using one or more optical elements from being (i) natural Gaussian shaped to being (ii) superposition of multiple natural Gaussian beams with an offset.

In some embodiments, the system comprises: a Middle Wave Infra-Red (MWIR) QCL-based laser transmitter, that includes one or more Quantum Cascade Laser (QCL) based laser emitters, which produce one or more laser beams that are modified using one or more optical elements from being (i) natural Gaussian shaped to being (ii) superposition of multiple natural Gaussian beams without offset.

In some embodiments, the system comprises: a Middle Wave Infra-Red (MWIR) laser-diode based laser transmitter, a Short-Wave Infra-Red (SWIR) laser-diode based laser transmitter, and another laser-diode based laser transmitter that generates a laser beam at visible wavelength; wherein each one of said laser-diode based laser transmitters produces laser beams that are modified, by one or more optical elements, from being natural Gaussian shaped to being Top Hat shaped.

In some embodiments, the system comprises: a Middle Wave Infra-Red (MWIR) laser-diode based laser transmitter, a Short-Wave Infra-Red (SWIR) laser-diode based laser transmitter, and another laser-diode based laser transmitter that generates a laser beam at visible wavelength; wherein each one of said laser-diode based laser transmitters produces laser beams that are modified, by one or more optical elements, from being (i) natural Gaussian shaped to being (ii) superposition of multiple natural Gaussian beams with an offset.

In some embodiments, the system comprises: a Middle Wave Infra-Red (MWIR) laser-diode based laser transmitter, a Short-Wave Infra-Red (SWIR) laser-diode based laser transmitter, another laser-diode based laser transmitter that generates a laser beam at visible wavelength; wherein each one of said laser-diode based laser transmitters produces laser beams that are modified, by one or more optical elements, from being (i) natural Gaussian shaped to being (ii) superposition of multiple natural Gaussian beams without offset.

In some embodiments, the directed high-power laser transmitter comprises two or more laser emitters that generate two or more laser beams; wherein an optical element that is internal to the directed high-power laser transmitter combines the two or more laser beams internally within the directed high-power laser transmitter and outputs a combined high-power laser beam.

In some embodiments, the directed high-power laser transmitter comprises at least one QCL-based laser emitter and at least one diode-based laser emitter, that generate two or more laser beams; wherein an optical element that is internal to the directed high-power laser transmitter combines the two or more laser beams that are generated by the QCL-based laser emitter and by the diode-based laser emitter, internally within the directed high-power laser transmitter, and outputs a combined high-power laser beam.

In some embodiments, the system comprises: a first thermoelectric cooler (TEC) unit that is attached to a QCL-based laser emitter of said directed high-power laser transmitter; a second thermoelectric cooler (TEC) unit that is attached to a laser-diode based laser emitter of said directed high-power laser transmitter; a third thermoelectric cooler (TEC) unit that is attached to a passive optical FPA detector that is integrated within said directed high-power laser transmitter. In some embodiments, at least one of said TEC units comprises a cascade structure of multiple TEC layers.

In some embodiments, said directed high-power laser transmitter is implemented as a single high-power lase unit which is (i) thermally isolated from external thermal impacts of a nearby gimbaling mechanism that performs gimbaling of said directed high-power laser transmitter, and which is (ii) attached to an external thermoelectric cooler (TEC) unit.

In some embodiments, said directed high-power laser transmitter is implemented as a single high-power lase unit which is (i) thermally isolated from external thermal impacts of a nearby gimbaling mechanism that performs gimbaling of said directed high-power laser transmitter, and which is (ii) attached to an external thermoelectric cooler (TEC) unit; wherein said external TEC unit stabilizes a working temperature of said directed high-power laser transmitter during a time period in which the directed high-power laser transmitter is non-operational between two consecutive iterations of emitting laser pulses towards a threat.

In some embodiments, the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat.

In some embodiments, the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat; wherein a single, shared, optical path is shared by (i) outgoing countermeasure laser beams towards said threat, and (ii) incoming optical feedback that is incoming from said threat and is analyzed by said FPA detector.

In some embodiments, the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat; wherein a single, shared, optical path is shared via frequency-domain separation of (i) outgoing countermeasure laser beams towards said threat, and (ii) incoming optical feedback that is incoming from said threat and is analyzed by said FPA detector.

In some embodiments, the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat; wherein a single, shared, optical path is shared via time-domain separation of (i) outgoing countermeasure laser beams towards said threat, and (ii) incoming optical feedback that is incoming from said threat and is analyzed by said FPA detector.

In some embodiments, the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat; wherein a single, shared, optical path is shared by (i) outgoing countermeasure laser beams towards said threat, and (ii) incoming optical feedback that is incoming from said threat and is analyzed by said FPA detector, by using an optical element that diverts optical signals and enables shared utilization of said optical path.

In some embodiments, the system comprises: (a1) one or more QCL-based laser transmitters, and (a2) one or more laser-diode based laser transmitters, and (b) a passive optical FPA detector, which are installed together within a single high-power laser transmitter unit.

In some embodiments, the system comprises: (a1) one or more QCL-based laser transmitters, and (a2) one or more laser-diode based laser transmitters, and (b) a passive optical FPA detector, which are installed together within a single high-power laser transmitter unit; wherein (i) laser beams outputted by the laser transmitters, and (ii) optical signals incoming towards the passive optical FPA detector, are separated from each other in frequency domain.

In some embodiments, the system comprises: (a1) one or more QCL-based laser transmitters, and (a2) one or more laser-diode based laser transmitters, and (b) a passive optical FPA detector, which are installed together within a single high-power laser transmitter unit; wherein (i) laser beams outputted by the laser transmitters, and (ii) optical signals incoming towards the passive optical FPA detector, are separated from each other in time domain.

In some embodiments, the system comprises: (a1) one or more QCL-based laser transmitters, and (a2) one or more laser-diode based laser transmitters, and (b) a passive optical FPA detector, which are installed together within a single high-power laser transmitter unit; wherein (i) laser beams outputted by the laser transmitters, and (ii) optical signals incoming towards the passive optical FPA detector, are separated from each other via an optical element that selectively diverts or blocks some but not all optical signals.

In some embodiments, the system comprises: (a) a QCL-based laser emitter, to transmit a first laser beam at a first wavelength towards said threat, and (b) a laser-diode based laser emitter, to transmit a second laser beam at a second, different, wavelength towards said threat; wherein the first laser beam and the second laser beam are concurrently transmitted towards said threat as two discrete laser beams.

In some embodiments, the system comprises: (a) a QCL-based laser emitter, to transmit a first laser beam at a first wavelength at a first direction; (b) a laser-diode based laser emitter, to transmit a second laser beam at a second, different, wavelength at a second, different, direction; (c) an optical element that combines the first laser beam and the second laser beam into a unified laser beam which is outgoing towards said threat which is located at a third, different, direction.

In some embodiments, the system comprises: (a) a QCL-based laser emitter, to transmit a first laser beam at a first wavelength towards said threat, and (b) a laser-diode based laser emitter, to transmit a second laser beam at a second, different, wavelength towards said threat; (c) a selective activation controller, to selectively activate and de-activate the QCL-based laser emitter and/or the laser-diode based laser emitter, based on a pre-defined frequency-domain scheme.

In some embodiments, the system comprises: (a) a QCL-based laser emitter, to transmit a first laser beam at a first wavelength towards said threat, and (b) a laser-diode based laser emitter, to transmit a second laser beam at a second, different, wavelength towards said threat; (c) a selective activation controller, to selectively activate and de-activate the QCL-based laser emitter and/or the laser-diode based laser emitter, based on a pre-defined time-domain timing scheme.

In some embodiments, more than 50 percent of a total volume of the directed high-power laser transmitter, is integrally structured within said dual frequency RF module.

In some embodiments, an entirety of the directed high-power laser transmitter, is integrally structured within said dual frequency RF module.

In some embodiments, the system comprises: a gimbaling mechanism to gimbal the directed high-power laser transmitter towards said threat.

In some embodiments, the system comprises: a gimbaling mechanism to gimbal the directed high-power laser transmitter towards said threat; wherein the directed high-power laser transmitter commences to emit laser beams prior to being directed towards said threat.

In some embodiments, the system is encapsulated in a Line-Replaceable Unit (LRU) housing, to enable rapid and modular mounting and dismounting of the system relative to said aircraft.

In some embodiments, the system comprises: a dual-stage thermo-electric cooling (TEC) unit, comprising a first-stage TEC element and a second-stage TEC element; wherein the first-stage TEC element evacuates heat from the system towards the second-stage TEC element; wherein the second-stage TEC element evacuates heat away from the system.

In some embodiments, the system comprises: a dual-stage thermo-electric cooling (TEC) unit, comprising a first-stage TEC element and a second-stage TEC element; wherein the first-stage TEC element evacuates heat from the system, partially away from the system and partially towards the second-stage TEC element; wherein the second-stage TEC element evacuates heat away from the system.

In some embodiments, the directed high-power laser transmitter is implemented as a high-power laser module which comprises: (a) a first laser transmitter comprising multiple Quantum Cascade Laser (QCL) based laser emitters, which emit multiple laser beams that are combined within the first laser transmitter into a first combined laser beam by a first optical adder element; (b) a second laser transmitter comprising multiple laser-diode based laser emitters, which emit multiple laser beams in visible wavelengths that are combined within the second laser transmitter into a second combined laser beam by a second optical adder element; (c) a third laser transmitter comprising multiple laser-diode based laser emitters, which emit multiple laser beams in visible wavelengths that are combined within the third laser transmitter into a third combined laser beam by a third optical adder element; (d) a fourth optical adder element, to combine the first combined laser beam and the second combined laser beam and the third combined laser beam, into a unified outgoing laser beam that is directed towards the threat.

In some embodiments, the directed high-power laser transmitter is implemented as a high-power laser module which comprises: (a) a first laser transmitter comprising multiple Quantum Cascade Laser (QCL) based laser emitters, which emit multiple laser beams that are combined within the first laser transmitter into a first combined laser beam by a first optical adder element; (b) a second laser transmitter comprising multiple laser-diode based laser emitters, which emit multiple laser beams in visible and/or any other wavelengths that are combined within the second laser transmitter into a second combined laser beam by a second optical adder element; (c) a third laser transmitter comprising multiple laser-diode based laser emitters, which emit multiple laser beams in visible and/or any other wavelengths that are combined within the third laser transmitter into a third combined laser beam by a third optical adder element; wherein at least two of: (i) the first combined laser beam, (ii) the second combined laser beam, (iii) the third combined laser beam, are initially emitted in one or more directions that are non-directed towards the threat; (d) a fourth optical adder element, to combine the first combined laser beam and the second combined laser beam and the third combined laser beam, into a unified outgoing laser beam that is directed towards the threat.

In some embodiments, the directed high-power laser transmitter is implemented as a high-power laser module which comprises: (a) a first laser transmitter comprising multiple Quantum Cascade Laser (QCL) based laser emitters, which emit multiple laser beams that are combined within the first laser transmitter into a first combined laser beam by a first optical adder element; (b) a second laser transmitter comprising multiple laser-diode based laser emitters, which emit multiple laser beams in visible and/or any other wavelengths that are combined within the second laser transmitter into a second combined laser beam by a second optical adder element; (c) a third laser transmitter comprising multiple laser-diode based laser emitters, which emit multiple laser beams in visible and/or any other wavelengths that are combined within the third laser transmitter into a third combined laser beam by a third optical adder element; wherein at least two of: (i) the first combined laser beam, (ii) the second combined laser beam, (iii) the third combined laser beam, are initially emitted in one or more directions that are non-directed towards the threat; (d) a fourth optical adder element, to combine the first combined laser beam and the second combined laser beam and the third combined laser beam, into a unified outgoing laser beam that is directed towards the threat; wherein the first laser transmitter, the second laser transmitter, the third laser transmitter, and the fourth optical adder element, are comprised in a single radome that enables pass-through of laser beams.

In some embodiments, the system comprises: a processor that performs threat confirmation, threat tracking, and initiation of countermeasure functions against said threat, based on real-time data analysis; wherein the processor performs a method comprising: (a) initiating an optical threat confirmation process via an optical sensor of the system; (b) initiating a high-band RF-based threat confirmation process, performed at least concurrently with the optical threat confirmation process of step (a); then, (c) initiating a low-band RF-based threat confirmation process, performed at least concurrently with the optical threat confirmation process of step (a), and performed at least concurrently with the high-band RF-based threat confirmation process of step (b); then, (d) based on data received from the process of step (a) and the process of step (b) and the process of step (c), determining whether the threat is a confirmed threat.

In some embodiments, the system comprises: (e) if it is determined in step (d) that the threat is a confirmed threat, then the processor or the system performs: initiating a high-band RF-based threat tracking process, and an optical threat tracking process, which are performed at least partially concurrently; and further deploying, at least partially concurrently, one or more counter-measures against the confirmed threat which is being tracked.

In some embodiments, the system comprises: (e) if it is determined in step (d) that the threat is a confirmed threat, then the processor or the system performs: initiating a high-band RF-based threat tracking process using a first wavelength, and an optical threat tracking process using a second wavelength, which are performed at least partially concurrently; and further deploying, at least partially concurrently, one or more counter-measures against the confirmed threat using a third wavelength.

In some embodiments, the system comprises: (e) if it is determined in step (d) that the threat is a confirmed threat, then the processor or the system performs: initiating a high-band RF-based threat tracking process using a first wavelength, and an optical threat tracking process using a second wavelength, which are performed at least partially concurrently; and further deploying, at least partially concurrently, one or more counter-measures against the confirmed threat using a third wavelength; wherein all of (i) the high-band RF-based threat tracking process using the first wavelength, and the optical threat tracking process using the second wavelength, and (iii) the counter-measures against the confirmed threat using the third wavelength, utilize a unified aperture for signal transmission and signal reception.

In some embodiments, all the components of said system are comprised in a single protective radome, that enables (i) pass-through of laser beams and (ii) pass-through of visible optical signals and (iii) pass-through of UV signals and (iv) pass-through of IR signals and (v) pass-through of RF signals; wherein the protective radome further comprises therein: (I) a first set of mechanical fins located internally within the protective radome, to evacuate heat from one or more components within the protective radome towards a flat base of the protective radome; (II) a second set of mechanical fins located internally within the protective radome, to evacuate heat from within the protective radome towards a curved enclosure of the protective radome.

In some embodiments, all the components of said system are comprised in a single protective radome, that enables (i) pass-through of laser beams and (ii) pass-through of visible optical signals and (iii) pass-through of UV signals and (iv) pass-through of IR signals and (v) pass-through of RF signals; wherein the protective radome further comprises therein: (I) a first set of mechanical fins located internally within the protective radome, to evacuate heat from one or more components within the protective radome towards a flat base of the protective radome; (II) a second set of mechanical fins located internally within the protective radome, to evacuate heat from within the protective radome towards a curved enclosure of the protective radome; (III) a set of internal fans located internally within the protective radome, to evacuate heat from within the protective radome towards the curved enclosure of the protective radome;

wherein a set of external fans are connected externally to the protective radome, to evacuate heat from the protective radome towards an external environment of the protective radome.

In some embodiments, the system further comprises said aircraft.

Some embodiments of the present invention may be implemented by utilizing any suitable combination of hardware components and/or software modules; as well as other suitable units or sub-units, processors, controllers, DSPs, FPGAs, CPUs, Integrated Circuits, output units, input units, memory units, long-term or short-term storage units, buffers, power source(s), wired links, wireless communication links, transceivers, Operating System(s), software applications, drivers, or the like.

Any of the above-mentioned devices, units and/or systems, may be implemented by using suitable hardware components and/or software components; for example, a processor, a processing core, a Central Processing Unit (CPU), a Digital Signal Processor (DSP), an Integrated Circuit (IC), and Application-Specific Integrated Circuit (ASIC), a memory unit (e.g., Random Access Memory (RAM), Flash memory), a storage unit (e.g., hard disk drive (HDD), solid state drive (SDD), Flash memory), an input unit (keyboard, keypad, mouse, joystick, touch-pad, touch-screen, microphone), an output unit (screen, touch-screen, monitor, audio speakers), a power source (battery, rechargeable battery, power cell, connection to electric outlet), a wireless transceiver, a cellular transceiver, a wired or wireless modem, a network interface card or element, an accelerometer, a gyroscope, a compass unit, a Global Positioning System (GPS) unit, an Operating System (OS), drivers, applications, and/or other suitable components.

In some implementations, calculations, operations and/or determinations may be performed locally within a single device, or may be performed by or across multiple devices, or may be performed partially locally and partially remotely (e.g., at a remote component or a co-located component) by optionally utilizing a communication channel to exchange raw data and/or processed data and/or processing results.

Although portions of the discussion herein relate, for demonstrative purposes, to wired links and/or wired communications, some implementations are not limited in this regard, but rather, may utilize wired communication and/or wireless communication; may include one or more wired and/or wireless links; may utilize one or more components of wired communication and/or wireless communication; and/or may utilize one or more methods or protocols or standards of wireless communication.

Some implementations may utilize a special-purpose machine or a specific-purpose device that is not a generic computer, or may use a non-generic computer or a non-general computer or machine. Such system or device may utilize or may comprise one or more components or units or modules that are not part of a "generic computer" and that are not part of a "general purpose computer", for example, cellular transceiver, cellular transmitter, cellular receiver, GPS unit, location-determining unit, accelerometer(s), gyroscope(s), device-orientation detectors or sensors, device-positioning detectors or sensors, or the like.

Some implementations may utilize an automated method or automated process, or a machine-implemented method or process, or as a semi-automated or partially-automated method or process, or as a set of steps or operations which may be executed or performed by a computer or machine or system or other device.

Some implementations may utilize code or program code or machine-readable instructions or machine-readable code, which may be stored on a non-transitory storage medium or non-transitory storage article (e.g., a CD-ROM, a DVD-ROM, a physical memory unit, a physical storage unit), such that the program or code or instructions, when executed by a processor or a machine or a computer, cause such processor or machine or computer to perform a method or process as described herein. Such code or instructions may be or may comprise, for example, one or more of: software, a software module, an application, a program, a subroutine, instructions, an instruction set, computing code, words, values, symbols, strings, variables, source code, compiled code, interpreted code, executable code, static code, dynamic code; including (but not limited to) code or instructions in high-level programming language, low-level programming language, object-oriented programming language, visual programming language, compiled programming language, interpreted programming language, C, C++, C#, Java, JavaScript, SQL, Ruby on Rails, Go, Cobol, Fortran, ActionScript, AJAX, XML, JSON, Lisp, Eiffel, Verilog, Hardware Description Language (HDL), Register-Transfer Level (RTL), BASIC, Visual BASIC, Matlab, Pascal, HTML, HTML5, CSS, Perl, Python, PHP, machine language, machine code, assembly language, or the like.

Discussions herein utilizing terms such as, for example, "processing", "computing", "calculating", "determining", "establishing", "analyzing", "checking", "detecting", "measuring", or the like, may refer to operation(s) and/or process(es) of a processor, a computer, a computing platform, a computing system, or other electronic device or computing device, that may automatically and/or autonomously manipulate and/or transform data represented as physical (e.g., electronic) quantities within registers and/or accumulators and/or memory units and/or storage units into other data or that may perform other suitable operations.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments", "some embodiments", and/or similar terms, may indicate that the embodiment(s) so described may optionally include a particular feature, structure, or characteristic, but not every embodiment necessarily includes the particular feature, structure, or characteristic. Furthermore, repeated use of the phrase "in one embodiment" does not necessarily refer to the same embodiment, although it may. Similarly, repeated use of the phrase "in some embodiments" does not necessarily refer to the same set or group of embodiments, although it may.

As used herein, and unless otherwise specified, the utilization of ordinal adjectives such as "first", "second", "third", "fourth", and so forth, to describe an item or an object, merely indicates that different instances of such like items or objects are being referred to; and does not intend to imply as if the items or objects so described must be in a particular given sequence, either temporally, spatially, in ranking, or in any other ordering manner.

Functions, operations, components and/or features described herein with reference to one or more implementations, may be combined with, or may be utilized in combination with, one or more other functions, operations, components and/or features described herein with reference to one or more other implementations. Some embodiments may comprise any possible or suitable combinations, rearrangements, assembly, re-assembly, or other utilization of some or all of the modules or functions or components or units that are described herein, even if they are discussed in different locations or different chapters of the above discussion, or even if they are shown across different drawings or multiple drawings.

While certain features of some demonstrative embodiments have been illustrated and described herein, various modifications, substitutions, changes, and equivalents may occur to those skilled in the art. Accordingly, the claims are intended to cover all such modifications, substitutions, changes, and equivalents.

What is claimed is:

1. A system for protecting an aircraft against a threat, the system comprising:
(A) a dual frequency Radio Frequency (RF) module, comprising:
  (A1) a dual-band RF transmitter and a dual-band RF receiver, to transmit and receive high-band RF signals and low-band RF signals; and
  (A2) a threat confirmation and tracking module, to confirm and track a possible incoming threat based on processing of high-band RF signals and low-band RF signals received by the dual-band RF receiver;
(B) a dual frequency band antenna, to transmit and receive the high-band RF signals and the low-band RF signals;
(C) a directed high-power laser transmitter, to activate a directed high-power laser beam as countermeasure towards a precise angular position of a confirmed threat.

2. The system according to claim 1,
wherein the directed high-power laser transmitter is implemented as a high-power laser module which comprises:
(a) a laser transmitter that comprises one or more Quantum Cascade Laser (QCL) based laser emitters, which produce laser beams and/or optical output power that is combined within the laser transmitter by using one or more optical elements for combining optical signals and/or laser beams;
(b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined within said set of one or more laser transmitters by using one or more optical elements for combining optical signals and/or laser beams.

3. The system according to claim 1,
wherein the directed high-power laser transmitter is implemented as a high-power laser module which comprises:
(a) a laser transmitter that comprises one or more Quantum Cascade Laser (QCL) based laser emitters, which produce laser beams and/or optical output power that is combined internally to said high-power laser module but externally to the laser transmitter by using one or more optical elements for combining optical signals and/or laser beams;
(b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined internally to said high-power laser module but externally to said set of one or more laser transmitters by using one or more optical elements for combining optical signals and/or laser beams.

4. The system according to claim 1,
wherein the directed high-power laser transmitter is implemented as a high-power laser module which comprises:
(a) a laser transmitter that comprises one or more Quantum Cascade Laser (QCL) based laser emitters, which produce laser beams and/or optical output power that is combined within the laser transmitter by using one or more optical elements for combining optical signals and/or laser beams;
(b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined within said set of one or more laser transmitters by using one or more optical elements for combining optical signals and/or laser beams.

5. The system according to claim 1,
wherein the directed high-power laser transmitter is implemented as a high-power laser module which comprises:
(a) a laser transmitter that comprises one or more Quantum Cascade Laser (QCL) based laser emitters, which produce laser beams and/or optical output power that is combined internally to said high-power laser module but externally to the laser transmitter by using one or more optical elements for combining optical signals and/or laser beams;
(b) a set of one or more laser transmitters that are based on laser-diode laser emitters, that emit laser beams and/or optical output in one or more Infra-Red (IR) wavelengths and/or visible wavelengths, and which produce laser beams and/or optical output power that are combined internally to said high-power laser module but externally to said set of one or more laser transmitters by using one or more optical elements for combining optical signals and/or laser beams;
(c) an optical Focal Point Array (FPA) detector, that receives an incoming optical signal that is incoming from said threat, wherein the incoming optical signal is at infrared (IR) or at visible light wavelength, and wherein the optical FPA detector analyzes the incoming optical signal to generate one or more insights regarding one or more characteristics of the threat.

6. The system according to claim 1, comprising:
a processor that performs confirmation, tracking and countermeasure functions against said threat, based on real-time data that is analyzed and exchanged between (i) a dual frequency RF module, and a laser module having an optical FPA detector;
wherein the exchanged data comprises one or more of: (a) threat distance or threat range, (b) threat velocity, (c) estimated physical size of the threat.

7. The system according to claim 1, comprising:
a processor that performs confirmation, tracking and countermeasure functions against said threat, based on real-time data that is analyzed and exchanged between (i) a dual frequency RF module, and a laser module having an optical FPA detector;
wherein the exchanged data comprises one or more of: (a) threat distance or threat range, (b) threat velocity, (c) estimated physical size of the threat;
wherein real-time data that is generated by said dual frequency RF module, is transferred to, and modifies the operation of, said laser module having an optical FPA detector.

8. The system according to claim 1, comprising:
a processor that performs confirmation, tracking and countermeasure functions against said threat, based on real-time data that is analyzed and exchanged between (i) a dual frequency RF module, and a laser module having an optical FPA detector;
wherein the exchanged data comprises one or more of: (a) threat distance or threat range, (b) threat velocity, (c) estimated physical size of the threat;
wherein real-time data that is generated by said laser module having an optical FPA detector is transferred to, and modifies the operation of, said dual frequency RF module.

9. The system according to claim 1, comprising:
a Middle Wave Infra-Red (MWIR) QCL-based laser transmitter, that includes one or more Quantum Cascade Laser (QCL) based laser emitters, which produce one or more laser beams that are modified using one or more optical elements from being natural Gaussian shaped to being Top Hat shaped.

10. The system according to claim 1, comprising:
a Middle Wave Infra-Red (MWIR) QCL-based laser transmitter, that includes one or more Quantum Cascade Laser (QCL) based laser emitters, which produce one or more laser beams that are modified using one or more optical elements from being (i) natural Gaussian shaped to being (ii) superposition of multiple natural Gaussian beams with an offset.

11. The system according to claim 1, comprising:
a Middle Wave Infra-Red (MWIR) QCL-based laser transmitter, that includes one or more Quantum Cascade Laser (QCL) based laser emitters, which produce one or more laser beams that are modified using one or more optical elements from being (i) natural Gaussian shaped to being (ii) superposition of multiple natural Gaussian beams without offset.

12. The system according to claim 1, further comprising:
a Middle Wave Infra-Red (MWIR) laser-diode based laser transmitter,
a Short-Wave Infra-Red (SWIR) laser-diode based laser transmitter,
another laser-diode based laser transmitter that generates a laser beam at visible wavelength;
wherein each one of said laser-diode based laser transmitters produces laser beams that are modified, by one or more optical elements, from being natural Gaussian shaped to being Top Hat shaped.

13. The system according to claim 1, further comprising:
a Middle Wave Infra-Red (MWIR) laser-diode based laser transmitter,
a Short-Wave Infra-Red (SWIR) laser-diode based laser transmitter,
another laser-diode based laser transmitter that generates a laser beam at visible wavelength;
wherein each one of said laser-diode based laser transmitters produces laser beams that are modified, by one or more optical elements, from being (i) natural Gaussian shaped to being (ii) superposition of multiple natural Gaussian beams with an offset.

14. The system according to claim 1, further comprising:
a Middle Wave Infra-Red (MWIR) laser-diode based laser transmitter,
a Short-Wave Infra-Red (SWIR) laser-diode based laser transmitter,
another laser-diode based laser transmitter that generates a laser beam at visible wavelength;
wherein each one of said laser-diode based laser transmitters produces laser beams that are modified, by one or more optical elements, from being (i) natural Gaussian shaped to being (ii) superposition of multiple natural Gaussian beams without offset.

15. The system according to claim 1,
wherein the directed high-power laser transmitter comprises two or more laser emitters that generate two or more laser beams;
wherein an optical element that is internal to the directed high-power laser transmitter combines the two or more laser beams internally within the directed high-power laser transmitter and outputs a combined high-power laser beam.

16. The system according to claim 1,
wherein the directed high-power laser transmitter comprises at least one QCL-based laser emitter and at least one diode-based laser emitter, that generate two or more laser beams;
wherein an optical element that is internal to the directed high-power laser transmitter combines the two or more laser beams that are generated by the QCL-based laser emitter and by the diode-based laser emitter, internally within the directed high-power laser transmitter, and outputs a combined high-power laser beam.

17. The system according to claim 1, further comprising:
a first thermoelectric cooler (TEC) unit that is attached to a QCL-based laser emitter of said directed high-power laser transmitter;
a second thermoelectric cooler (TEC) unit that is attached to a laser-diode based laser emitter of said directed high-power laser transmitter;
a third thermoelectric cooler (TEC) unit that is attached to a passive optical FPA detector that is integrated within said directed high-power laser transmitter.

18. The system according to claim 17,
wherein at least one of said TEC units comprises a cascade structure of multiple TEC layers.

19. The system according to claim 1,
wherein said directed high-power laser transmitter is implemented as a single high-power lase unit which is (i) thermally isolated from external thermal impacts of a nearby gimbaling mechanism that performs gimbaling of said directed high-power laser transmitter, and which is (ii) attached to an external thermoelectric cooler (TEC) unit.

20. The system according to claim 1,
wherein said directed high-power laser transmitter is implemented as a single high-power lase unit which is (i) thermally isolated from external thermal impacts of a nearby gimbaling mechanism that performs gimbaling of said directed high-power laser transmitter, and which is (ii) attached to an external thermoelectric cooler (TEC) unit;
wherein said external TEC unit stabilizes a working temperature of said directed high-power laser transmitter during a time period in which the directed high-power laser transmitter is non-operational between two consecutive iterations of emitting laser pulses towards a threat.

21. The system according to claim 1,
wherein the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat.

22. The system according to claim 1,
wherein the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat;
wherein a single, shared, optical path is shared by (i) outgoing countermeasure laser beams towards said threat, and (ii) incoming optical feedback that is incoming from said threat and is analyzed by said FPA detector.

23. The system according to claim 1,
wherein the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat;
wherein a single, shared, optical path is shared via frequency-domain separation of (i) outgoing countermeasure laser beams towards said threat, and (ii) incoming optical feedback that is incoming from said threat and is analyzed by said FPA detector.

24. The system according to claim 1,
wherein the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat;
wherein a single, shared, optical path is shared via time-domain separation of (i) outgoing countermeasure laser beams towards said threat, and (ii) incoming optical feedback that is incoming from said threat and is analyzed by said FPA detector.

25. The system according to claim 1,
wherein the integrated laser-and-sensor module comprises integrally both (I) the directed high-power laser transmitter that transmits laser beams as a countermeasure towards a threat, and also (II) an optical Focal Point Array (FPA) detector which is internal and integral to said integrated laser-and-sensor module and which receives and analyzes optical feedback that is incoming from said threat;
wherein a single, shared, optical path is shared by (i) outgoing countermeasure laser beams towards said threat, and (ii) incoming optical feedback that is incoming from said threat and is analyzed by said FPA detector, by using an optical element that diverts optical signals and enables shared utilization of said optical path.

26. The system according to claim 1, comprising:
(a1) one or more QCL-based laser transmitters, and
(a2) one or more laser-diode based laser transmitters, and
(b) a passive optical FPA detector,
which are installed together within a single high-power laser transmitter unit.

27. The system according to claim 1, comprising:
(a1) one or more QCL-based laser transmitters, and
(a2) one or more laser-diode based laser transmitters, and
(b) a passive optical FPA detector,
which are installed together within a single high-power laser transmitter unit;
wherein (i) laser beams outputted by the laser transmitters, and (ii) optical signals incoming towards the passive optical FPA detector, are separated from each other in frequency domain.

28. The system according to claim 1, comprising:
(a1) one or more QCL-based laser transmitters, and
(a2) one or more laser-diode based laser transmitters, and
(b) a passive optical FPA detector,
which are installed together within a single high-power laser transmitter unit;
wherein (i) laser beams outputted by the laser transmitters, and (ii) optical signals incoming towards the passive optical FPA detector, are separated from each other in time domain.

29. The system according to claim 1, comprising:
(a1) one or more QCL-based laser transmitters, and
(a2) one or more laser-diode based laser transmitters, and
(b) a passive optical FPA detector,
which are installed together within a single high-power laser transmitter unit;
wherein (i) laser beams outputted by the laser transmitters, and (ii) optical signals incoming towards the passive optical FPA detector, are separated from each other via an optical element that selectively diverts or blocks some but not all optical signals.

30. The system according to claim 1, comprising:
(a) a QCL-based laser emitter, to transmit a first laser beam at a first wavelength towards said threat, and
(b) a laser-diode based laser emitter, to transmit a second laser beam at a second, different, wavelength towards said threat;
wherein the first laser beam and the second laser beam are concurrently transmitted towards said threat as two discrete laser beams.

31. The system according to claim 1, comprising:
(a) a QCL-based laser emitter, to transmit a first laser beam at a first wavelength at a first direction;
(b) a laser-diode based laser emitter, to transmit a second laser beam at a second, different, wavelength at a second, different, direction;
(c) an optical element that combines the first laser beam and the second laser beam into a unified laser beam which is outgoing towards said threat which is located at a third, different, direction.

32. The system according to claim 1, comprising:
(a) a QCL-based laser emitter, to transmit a first laser beam at a first wavelength towards said threat, and
(b) a laser-diode based laser emitter, to transmit a second laser beam at a second, different, wavelength towards said threat;
(c) a selective activation controller, to selectively activate and de-activate the QCL-based laser emitter and/or the laser-diode based laser emitter, based on a pre-defined frequency-domain scheme.

33. The system according to claim 1, comprising:
(a) a QCL-based laser emitter, to transmit a first laser beam at a first wavelength towards said threat, and
(b) a laser-diode based laser emitter, to transmit a second laser beam at a second, different, wavelength towards said threat;
(c) a selective activation controller, to selectively activate and de-activate the QCL-based laser emitter and/or the laser-diode based laser emitter, based on a pre-defined time-domain timing scheme.

34. The system according to claim 1,
wherein more than 50 percent of a total volume of the directed high-power laser transmitter, is integrally structured within said dual frequency RF module.

35. The system according to claim 1,
wherein an entirety of the directed high-power laser transmitter, is integrally structured within said dual frequency RF module.

36. The system according to claim 1, further comprising:
a gimbaling mechanism to gimbal the directed high-power laser transmitter towards said threat.

37. The system according to claim 1, further comprising:
a gimbaling mechanism to gimbal the directed high-power laser transmitter towards said threat;
wherein the directed high-power laser transmitter commences to emit laser beams prior to being directed towards said threat.

38. The system according to claim 1,
wherein the system is encapsulated in a Line-Replaceable Unit (LRU) housing, to enable rapid and modular mounting and dismounting of the system relative to said aircraft.

39. The system according to claim 1, further comprising:
a dual-stage thermo-electric cooling (TEC) unit, comprising a first-stage TEC element and a second-stage TEC element;
wherein the first-stage TEC element evacuates heat from the system towards the second-stage TEC element;
wherein the second-stage TEC element evacuates heat away from the system.

40. The system according to claim 1, further comprising:
a dual-stage thermo-electric cooling (TEC) unit, comprising a first-stage TEC element and a second-stage TEC element;
wherein the first-stage TEC element evacuates heat from the system, partially away from the system and partially towards the second-stage TEC element;
wherein the second-stage TEC element evacuates heat away from the system.

41. The system according to claim 1,
wherein the directed high-power laser transmitter is implemented as a high-power laser module which comprises:
(a) a first laser transmitter comprising multiple Quantum Cascade Laser (QCL) based laser emitters, which emit multiple laser beams that are combined within the first laser transmitter into a first combined laser beam by a first optical adder element;
(b) a second laser transmitter comprising multiple laser-diode based laser emitters, which emit multiple laser beams in visible wavelengths that are combined within the second laser transmitter into a second combined laser beam by a second optical adder element;
(c) a third laser transmitter comprising multiple laser-diode based laser emitters, which emit multiple laser beams in visible wavelengths that are combined within the third laser transmitter into a third combined laser beam by a third optical adder element;
(d) a fourth optical adder element, to combine the first combined laser beam and the second combined laser beam and the third combined laser beam, into a unified outgoing laser beam that is directed towards the threat.

42. The system according to claim 1,
wherein the directed high-power laser transmitter is implemented as a high-power laser module which comprises:
(a) a first laser transmitter comprising multiple Quantum Cascade Laser (QCL) based laser emitters, which emit multiple laser beams that are combined within the first laser transmitter into a first combined laser beam by a first optical adder element;
(b) a second laser transmitter comprising multiple laser-diode based laser emitters, which emit multiple laser beams in visible and/or any other wavelengths that are combined within the second laser transmitter into a second combined laser beam by a second optical adder element;
(c) a third laser transmitter comprising multiple laser-diode based laser emitters, which emit multiple laser beams in visible and/or any other wavelengths that are combined within the third laser transmitter into a third combined laser beam by a third optical adder element;
wherein at least two of: (i) the first combined laser beam, (ii) the second combined laser beam, (iii) the third combined laser beam, are initially emitted in one or more directions that are non-directed towards the threat;
(d) a fourth optical adder element, to combine the first combined laser beam and the second combined laser beam and the third combined laser beam, into a unified outgoing laser beam that is directed towards the threat.

43. The system according to claim 1,
wherein the directed high-power laser transmitter is implemented as a high-power laser module which comprises:
(a) a first laser transmitter comprising multiple Quantum Cascade Laser (QCL) based laser emitters, which emit multiple laser beams that are combined within the first laser transmitter into a first combined laser beam by a first optical adder element;
(b) a second laser transmitter comprising multiple laser-diode based laser emitters, which emit multiple laser beams in visible and/or any other wavelengths that are combined within the second laser transmitter into a second combined laser beam by a second optical adder element;
(c) a third laser transmitter comprising multiple laser-diode based laser emitters, which emit multiple laser beams in visible and/or any other wavelengths that are combined within the third laser transmitter into a third combined laser beam by a third optical adder element;
wherein at least two of: (i) the first combined laser beam, (ii) the second combined laser beam, (iii) the third combined laser beam, are initially emitted in one or more directions that are non-directed towards the threat;
(d) a fourth optical adder element, to combine the first combined laser beam and the second combined laser beam and the third combined laser beam, into a unified outgoing laser beam that is directed towards the threat;
wherein the first laser transmitter, the second laser transmitter, the third laser transmitter, and the fourth optical adder element, are comprised in a single radome that enables pass-through of laser beams.

44. The system according to claim 1, comprising:
a processor that performs threat confirmation, threat tracking, and initiation of countermeasure functions against said threat, based on real-time data analysis;
wherein the processor performs a method comprising:
(a) initiating an optical threat confirmation process via an optical sensor of the system;
(b) initiating a high-band RF-based threat confirmation process, performed at least concurrently with the optical threat confirmation process of step (a);

(c) initiating a low-band RF-based threat confirmation process, performed at least concurrently with the optical threat confirmation process of step (a), and performed at least concurrently with the high-band RF-based threat confirmation process of step (b);
(d) based on data received from the process of step (a) and the process of step (b) and the process of step (c), determining whether the threat is a confirmed threat.

45. The system according to claim 44, comprising:
(e) if it is determined in step (d) that the threat is a confirmed threat, then:
 initiating a high-band RF-based threat tracking process, and an optical threat tracking process, which are performed at least partially concurrently; and further deploying, at least partially concurrently, one or more counter-measures against the confirmed threat which is being tracked.

46. The system according to claim 44, comprising:
(e) if it is determined in step (d) that the threat is a confirmed threat, then:
 initiating a high-band RF-based threat tracking process using a first wavelength, and an optical threat tracking process using a second wavelength, which are performed at least partially concurrently; and further deploying, at least partially concurrently, one or more counter-measures against the confirmed threat using a third wavelength.

47. The system according to claim 44, comprising:
(e) if it is determined in step (d) that the threat is a confirmed threat, then:
 initiating a high-band RF-based threat tracking process using a first wavelength, and an optical threat tracking process using a second wavelength, which are performed at least partially concurrently; and further deploying, at least partially concurrently, one or more counter-measures against the confirmed threat using a third wavelength;
 wherein all of (i) the high-band RF-based threat tracking process using the first wavelength, and the optical threat tracking process using the second wavelength, and (iii) the counter-measures against the confirmed threat using the third wavelength, utilize a unified aperture for signal transmission and signal reception.

48. The system according to claim 1,
 wherein all components of said system are comprised in a single protective radome, that enables (i) pass-through of laser beams and (ii) pass-through of visible optical signals and (iii) pass-through of UV signals and (iv) pass-through of IR signals and (v) pass-through of RF signals;
 wherein the protective radome further comprises therein:
 (I) a first set of mechanical fins located internally within the protective radome, to evacuate heat from one or more components within the protective radome towards a flat base of the protective radome;
 (II) a second set of mechanical fins located internally within the protective radome, to evacuate heat from within the protective radome towards a curved enclosure of the protective radome.

49. The system according to claim 1,
 wherein all components of said system are comprised in a single protective radome, that enables (i) pass-through of laser beams and (ii) pass-through of visible optical signals and (iii) pass-through of UV signals and (iv) pass-through of IR signals and (v) pass-through of RF signals;
 wherein the protective radome further comprises therein:
 (I) a first set of mechanical fins located internally within the protective radome, to evacuate heat from one or more components within the protective radome towards a flat base of the protective radome;
 (II) a second set of mechanical fins located internally within the protective radome, to evacuate heat from within the protective radome towards a curved enclosure of the protective radome;
 (III) a set of internal fans located internally within the protective radome, to evacuate heat from within the protective radome towards the curved enclosure of the protective radome;
 wherein a set of external fans are connected externally to the protective radome, to evacuate heat from the protective radome towards an external environment of the protective radome.

50. The system according to claim 1,
 further comprising said aircraft.

* * * * *